(12) United States Patent
Iwamizu

(10) Patent No.: US 12,033,941 B2
(45) Date of Patent: Jul. 9, 2024

(54) TRIMMING CIRCUIT AND TRIMMING METHOD

(71) Applicant: FUJI ELECTRIC CO., LTD., Kanagawa (JP)

(72) Inventor: Morio Iwamizu, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 613 days.

(21) Appl. No.: 17/235,956

(22) Filed: Apr. 21, 2021

(65) Prior Publication Data

US 2021/0280515 A1 Sep. 9, 2021

Related U.S. Application Data

(63) Continuation of application No. PCT/JP2020/015432, filed on Apr. 3, 2020.

(30) Foreign Application Priority Data

May 23, 2019 (JP) .................................. 2019-096539
Jul. 17, 2019 (JP) .................................. 2019-132095

(51) Int. Cl.
*H01L 23/525* (2006.01)
*H01L 21/768* (2006.01)
(Continued)

(52) U.S. Cl.
CPC .... *H01L 23/5256* (2013.01); *H01L 21/76886* (2013.01); *H01L 27/0255* (2013.01);
(Continued)

(58) Field of Classification Search
CPC ............. H01L 23/5256; H01L 27/0255; H01L 27/0629
See application file for complete search history.

(56) References Cited

U.S. PATENT DOCUMENTS

| 6,169,393 B1 | 1/2001 | Hashimoto |
| 2012/0299630 A1 | 11/2012 | Sakurai |
| 2014/0306750 A1* | 10/2014 | Toyoda ............... H01L 23/5256 327/525 |

FOREIGN PATENT DOCUMENTS

| JP | H04163934 A | 6/1992 |
| JP | H05267464 A | 10/1993 |

(Continued)

OTHER PUBLICATIONS

International Search Report and (ISA/237) Written Opinion of the International Search Authority for International Patent Application No. PCT/JP2020/015432, mailed by the Japan Patent Office dated Jun. 23, 2020.

(Continued)

*Primary Examiner* — Patrick O Neill

(57) ABSTRACT

A trimming circuit configured to output a voltage according to the presence or absence of disconnection of a fuse resistor is provided, including a fuse resistor formed by a polysilicon layer arranged on a semiconductor substrate via an insulating film, a pad for trimming connected to one end of the fuse resistor, an output terminal electrically connected to a connection point between the fuse resistor and the pad, and configured to output a voltage according to the presence or absence of disconnection of the fuse resistor, and a diode formed on the semiconductor substrate, having one end connected to the other end of the fuse resistor.

18 Claims, 19 Drawing Sheets

(51) Int. Cl.
*H01L 27/02* (2006.01)
*H01L 27/06* (2006.01)
*H01L 27/088* (2006.01)
*H01L 29/868* (2006.01)

(52) U.S. Cl.
CPC ........ *H01L 27/0629* (2013.01); *H01L 27/088* (2013.01); *H01L 29/868* (2013.01)

(56) References Cited

FOREIGN PATENT DOCUMENTS

| | | |
|---|---|---|
| JP | H07198794 A | 8/1995 |
| JP | 2000323650 A | 11/2000 |
| JP | 2000340656 A | 12/2000 |
| JP | 2018022848 A | 2/2018 |
| KR | 20010019304 A | 3/2001 |
| WO | 2010082781 A2 | 7/2010 |

OTHER PUBLICATIONS

Yoshiaki Toyoda et al., 60V-Class Power IC Technology for an Intelligent Power Switch with an Integrated Trench MOSFET, Proceedings of The 25th International Symposium on Power Semiconductor Devices & ICs, Kanazawa, p. 147-p. 150.

Yuka Morisawa et al., Hign-Side 2-in-1 IPS "F5114H" for Automobiles, Fuji Electric Review vol. 62—No. 4, 2016, p. 261-p. 264.

Office Action issued for counterpart Chinese Application 202080005737.6, issued by The State Intellectual Property Office of People's Republic of China dated Nov. 30, 2023.

* cited by examiner

21

TRIMMING CIRCUIT AND TRIMMING METHOD

The contents of the following Japanese patent applications are incorporated herein by reference:
NO. 2019-096539 filed in JP on May 23, 2019,
NO. 2019-132095 filed in JP on Jul. 17, 2019, and
PCT/JP2020/015432 filed in WO on Apr. 3, 2020

BACKGROUND

1. Technical Field

The present invention relates to a trimming circuit and a trimming method.

2. Related Art

A trimming circuit is used to correct fluctuation in circuit characteristics due to production tolerance in a semiconductor integrated circuit. A circuit including a fuse resistor formed of a polysilicon layer is known as the trimming circuit (Patent document 1, for example). In addition, a trimming circuit provided with an external terminal dedicated for trimming respectively on both ends of the fuse resistor is known (Patent document 2, for example).

PRIOR ART DOCUMENTS

Patent Documents

[Patent document 1] Japanese Unexamined Patent Application, Publication No. 2018-22848
[Patent document 2] Japanese Unexamined Patent Application, Publication No. 2000-340656

Technical Problem

The trimming circuit includes a body portion having a voltage of the output terminal fluctuating according to the presence or absence of disconnection of the fuse resistor, and an adjustment portion having a characteristic fluctuating according to the output voltage of the body portion. It is desirable to be able to confirm the voltage of the output terminal of the body portion, even after the trimming has been carried out and the fuse resistor has been disconnected.

GENERAL DISCLOSURE

One aspect of the present invention provides a trimming circuit. The trimming circuit may include a body portion configured to output a voltage according to the presence or absence of disconnection of the fuse resistor. The body portion may include a fuse resistor, a pad for trimming, an output terminal, and a diode. The fuse resistor may be formed by a polysilicon layer arranged on the semiconductor substrate via an insulating film. The pad may have one end connected to the fuse resistor. The output terminal may be electrically connected to a connection point between the fuse resistor and the pad. The output terminal may output a voltage according to the presence or absence of disconnection of the fuse resistor. The diode may be formed on the semiconductor substrate. The diode may have one end connected to another end of the fuse resistor.

The diode may include a semiconductor region of a second conductivity type formed on the semiconductor substrate of a first conductivity type.

The trimming circuit may include a first resistance portion. One end of the first resistance portion may be connected to a connection point between the fuse resistor and the diode. Another end of the first resistance portion may be connected to first potential.

The trimming circuit may include a second resistance portion. One end of the second resistance portion may be connected to a connection point between the fuse resistor and the pad. Another end of the second resistance portion may be connected to second potential.

The trimming circuit may include a protection diode. The protection diode may be connected between another end of the second resistance portion and the output terminal.

The trimming circuit may include a transistor portion. The transistor portion may be formed on the semiconductor substrate. A control terminal of the transistor portion may be connected to the output terminal of the body portion.

The diode may be a vertical diode. Another end of the diode may be connected to a substrate electrode of the semiconductor substrate.

The first conductivity type may be an n-type. The second conductivity type may be a p-type. Another end of the fuse resistor and an anode of the diode may be connected. The trimming circuit may include a first resistance portion. One end of the first resistance portion may be connected to a connection point between the fuse resistor and an anode of the diode. Another end of the first resistance portion may be connected to high-potential wiring. The trimming circuit may include a second resistance portion. One end of the second resistance portion may be connected to a connection point between the fuse resistor and the pad. Another end of the second resistance portion may be connected to ground wiring.

The first conductivity type may be a p-type. The second conductivity type may be an n-type. Another end of the fuse resistor and a cathode of the diode may be connected. The trimming circuit may include a first resistance portion. One end of the first resistance portion may be connected to a connection point between the fuse resistor and a cathode of the diode. Another end of the first resistance portion may be connected to ground wiring. The trimming circuit may include a second resistance portion. One end of the second resistance portion may be connected to a connection point between the fuse resistor and the pad. Another end of the second resistance portion may be connected to high-potential wiring.

The trimming circuit may include a plurality of body portions. The diode may be provided in common among the plurality of body portions. The other end of the fuse resistor of each of the body portions may be connected to the diode.

The trimming circuit may include a first resistance portion provided in common among a plurality of body portions, and having one end connected to the diode and another end connected to high-potential wiring. The other end of the fuse resistor of each of the body portions may be connected to the one end of the first resistance portion.

The trimming circuit may include a first resistance portion provided in common among the plurality of body portions, and having one end connected to the diode and another end connected to ground wiring. The other end of the fuse resistor of each of the body portions may be connected to the one end of the first resistance portion.

The other end of the fuse resistor of each of the body portions may be connected to a cathode of the diode.

The other end of the fuse resistor of each of the body portions may be connected to an anode of the diode.

Another aspect of the present invention may be a trimming method for adjusting an electrical property of an element to be adjusted using the above-mentioned trimming circuit. The trimming method may include adjusting potential of the semiconductor substrate and a voltage applied to the pad, such that a forward current flows through the diode. The trimming method may include disconnecting the fuse resistor due to the forward current flowing through the fuse resistor.

The trimming method may include applying a predetermined voltage to the pad before causing the forward current to flow through the diode, thereby generating a state in which the fuse resistor is virtually disconnected.

After the fuse resistor is disconnected, the pad and the output terminal may be electrically connected.

At the step of adjusting the voltage, a voltage may be selectively applied to the pad of the body portion of which the fuse resistor is to be disconnected.

High potential and ground potential may be applied to each of the body portions. At the step of adjusting the voltage, the ground potential applied to the body portion of which the fuse resistor is to be disconnected may be changed.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention, but the following embodiments are not intended to limit the invention of the claims. Moreover, not all combinations of features described in the embodiments are necessary to solutions of the invention.

Figure 1:
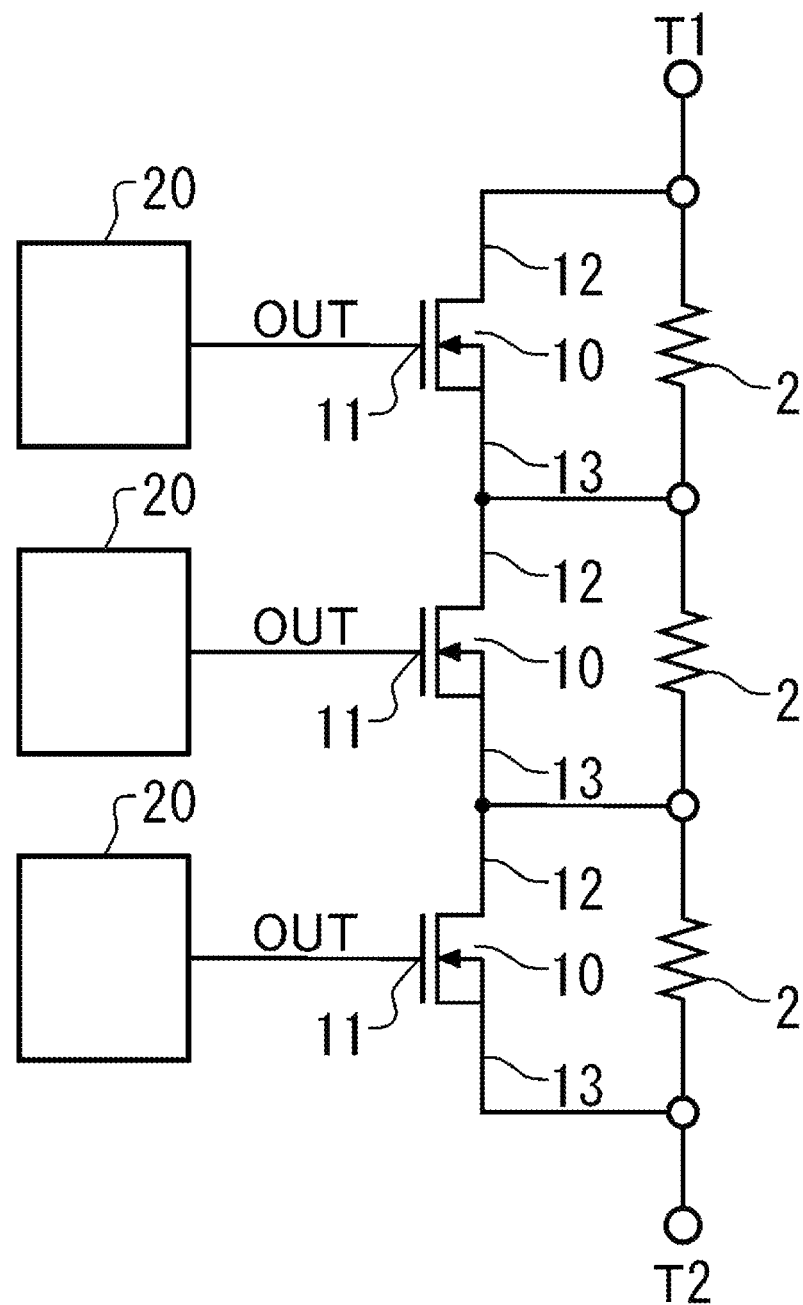
FIG. 1 illustrates a schematic configuration of a trimming circuit 100 according to one embodiment of the present invention.

FIG. 1 illustrates a schematic configuration of a trimming circuit 100 according to one embodiment of the present invention. In one example, the trimming circuit 100 adjusts the resistance value between internal terminals T1 and T2. A resistor is connected between the internal terminals T1 and T2 as an element to be adjusted. A plurality of elements to be adjusted 2 may be connected in series between the internal terminals T1 and T2. The trimming circuit 100 may adjust the resistance value between the internal terminals T1 and T2 by switching whether to short-circuit both ends of respective elements to be adjusted 2. The number of the elements to be adjusted 2 and the resistance value may be changed as appropriate. In addition, the elements to be adjusted 2 are not limited to resistors, and may be other elements such as MOSFETs. In this case, the trimming circuit 100 adjusts the electrical property of a serial MOSFET circuit in which MOSFETS are connected in series, for example.

In the present example, the trimming circuit 100 includes a body portion 20 and a transistor portion 10. In the present example, one body portion 20 and one transistor portion 10 make a set. The trimming circuit 100 may include a plurality of sets of the body portion 20 and the transistor portion 10. The number of the sets of the body portion 20 and the transistor portion 10 may be changed as appropriate. As the number of the sets of the body portion 20 and the transistor portion 10 increase, the electrical properties such as the resistance and current between the terminals T1 and T2 can be finely adjusted and the accuracy of adjustment can be improved.

The transistor portion 10 may be a MOS transistor. For example, the transistor portion 10 illustrated in FIG. 1 is an n-channel MOSFET. An element to be adjusted 2 is provided between a drain 12 and a source 13 of the transistor portion 10. That is, the element to be adjusted 2 of which the electrical property such as the current is to be adjusted, and the transistor portion 10 are connected in parallel. The gate 11 of the transistor portion 10 may be connected to an output terminal OUT of the body portion 20. The transistor portion 10 is one example of a switching device formed on the semiconductor substrate, and having a control terminal (gate terminal) connected to the output terminal OUT of the body portion 20.

In the present example, when the output terminal OUT of the body portion 20 is at a Lo level (low level), the transistor portion 10 is turned off. In this way, a corresponding element to be adjusted 2 is brought into a state in which both ends thereof are not short-circuited. On the other hand, when the output terminal OUT of the body portion 20 is at a Hi level (high level), the transistor portion 10 is turned on. When the transistor portion 10 is turned on, the corresponding element to be adjusted 2 is brought into a state in which both ends thereof are short-circuited. However, it is not limited to this case, and the transistor portion 10 may be configured such that the transistor portion 10 is turned on when the output terminal OUT of the body portion 20 is at the Lo level, and the transistor portion 10 is turned off when the output terminal OUT of the body portion 20 is at the Hi level.

Figure 2:
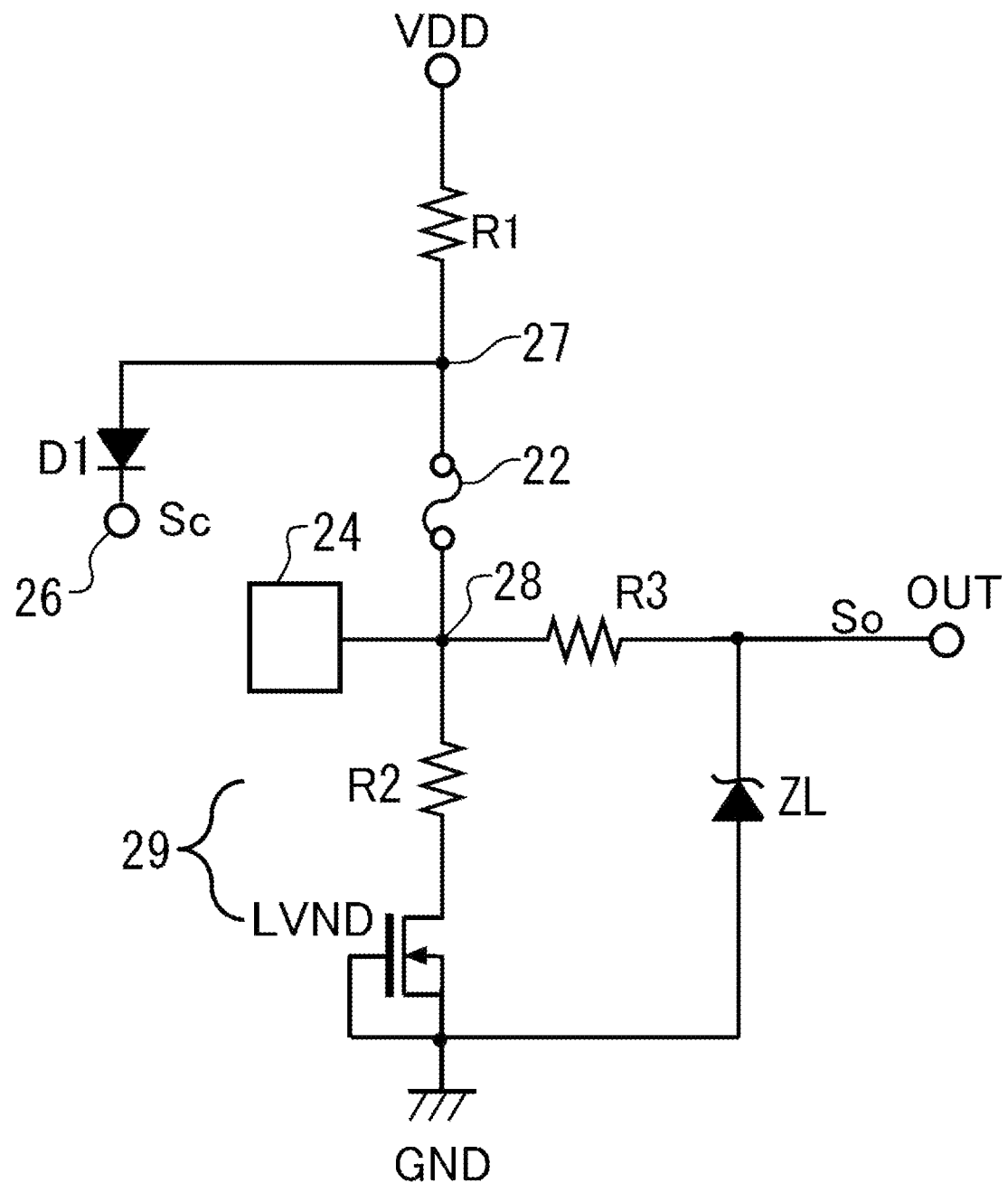
FIG. 2 is a circuit diagram illustrating one example of a body portion 20 in the trimming circuit 100 according to one embodiment of the present invention.

FIG. 2 is a circuit diagram illustrating one example of a body portion 20 in the trimming circuit 100. The trimming circuit 100 includes a fuse resistor 22, a pad 24 for trimming, a first diode D1, and an output terminal OUT. The trimming circuit 100 may include a first resistor element R1, a second resistance portion 29, a third resistor element R3, and a protection diode ZL.

The first resistor element R1 is one example of a first resistance portion.

The second resistance portion 29 of the present example may include a second resistor element R2 and a resistor element LVND. The resistor element LVND is a high-resistance element using a transistor. In the present example, the second resistor element R2 and the resistor element LVND are connected in series. The third resistor element R3 is one example of a third resistance portion. However, the first resistance portion, the second resistance portion, and the third resistance portion are not limited to these cases.

The trimming circuit 100 is a circuit for outputting a voltage So according to the presence or absence of disconnection of the fuse resistor 22 to the output terminal OUT. The trimming circuit 100 determines the on/off of the transistor portion 10 as described above, by changing the voltage So applied to the output terminal OUT according to disconnection of the fuse resistor 22. In addition, the trimming circuit 100 changes the voltage So also in a case where a virtual disconnection which generates a state in which the fuse resistor 22 is virtually disconnected is carried out.

One end of the fuse resistor 22 is connected to the pad 24 at a connection point 28. Another end of the fuse resistor 22 is connected to one end of a first diode D1 at a connection point 27. In the present example, another end of the fuse resistor 22 is connected to an anode of the first diode D1. The output terminal OUT is electrically connected to the connection point 28 between the fuse resistor 22 and the pad 24. In the present example, the output terminal OUT is electrically connected to the connection point 28 via the third resistor element R3. The output terminal OUT outputs a voltage according to the presence or absence of disconnection of the fuse resistor 22.

One end of the first resistor element R1 is connected to the connection point 27 between the fuse resistor 22 and the anode of the first diode D1. On the other hand, another end of the first resistor element R1 is connected to first potential. One end of the second resistance portion 29 is connected to the connection point 28 between one end of the fuse resistor 22 and the pad 24. On the other hand, another end of the second resistance portion 29 is connected to second potential. That is, one end of the fuse resistor 22 is connected to second potential via the second resistance portion 29. Although, in the present example, the second resistor element R2 is connected to the connection point 28 and the resistor element LVND is connected to second potential, the resistor element LVND may by connected to the connection point 28 and the second resistor element R2 may be connected to the second potential in a converse manner.

In the present example, the first potential may be a potential higher than the second potential. In the present example, the second potential corresponds to the potential (ground potential) of the ground wiring GND, and the first potential corresponds to the potential of the high-potential wiring VDD. The second potential may be at a Lo level that is substantially equal to the ground potential, and the first potential may be at a Hi level that is substantially equal to the potential of the high-potential wiring VDD. One end of the fuse resistor 22 may be connected to the high-potential wiring VDD via the first resistor element R1. Another end of the second resistance portion 29, in particular the gate and the drain of the resistor element LVND, may be connected to the ground wiring GND. The connection point 27 of the present example is a point on the high-potential wiring VDD side relative to the connection point 28. The connection point 27 may be arranged between the fuse resistor 22 and the high-potential wiring VDD. The connection point 28 may be arranged between the fuse resistor 22 and the ground wiring GND.

The protection diode ZL is connected between another end of the second resistance portion 29 and the output terminal OUT. In the present example, the anode of the protection diode ZL is connected to the ground wiring GND which is the second potential, and the cathode of the protection diode ZL is connected to the output terminal OUT.

The fuse resistor 22, the pad 24 for trimming, the first diode D1, the first resistor element R1, the second resistance portion 29, the third resistor element R3, and the protection diode ZL may be formed on the semiconductor substrate. The transistor portion 10 illustrated in FIG. 1 may also be formed on the same semiconductor substrate. The fuse resistor 22 is a polysilicon formed by a polysilicon layer, for example. The first diode D1 includes a semiconductor region of a second conductivity type on the semiconductor substrate of a first conductivity type. In one example, the first conductivity type is an n-type, and the second conductivity type is a p-type.

One end of the first diode D1 may be connected to a substrate electrode 26 of the semiconductor substrate. The substrate electrode 26 is an electrode for fixing the potential Sc of the semiconductor substrate of the first conductivity type. The substrate electrode 26 may be a back surface electrode arranged on the back surface of the semiconductor substrate, or may be an electrode arranged on the front surface.

The first resistor element R1 is a pull-up resistor for pulling up (dividing voltage) the output terminal OUT to potential of the high-potential wiring VDD in a state in which trimming is not carried out by the trimming circuit 100, as well as a current restricting resistor that restricts a current flowing through the fuse resistor 22. On the other hand, the second resistance portion 29 is a pull-down resistor for pulling down (dividing voltage) the output terminal OUT to ground potential in a state in which the fuse resistor 22 is disconnected. The second resistance portion 29 and the third resistor element R3 are also current restricting resistors that restrict a current flowing through the fuse resistor 22 as well. The resistance value of the first resistor element R1, the second resistance portion 29, and the third resistor element R3 may be adjusted such that the voltage So applied to the output terminal OUT turns into a level at which the transistor portion 10 is turned on, in a state where trimming has not been carried out and the fuse resistor 22 is not disconnected.

[Without Trimming]

In a state where trimming is not carried out by the trimming circuit 100, the output voltage So of the output terminal OUT is pulled up (dividing voltage) by the high-potential wiring VDD. In one example, the voltage applied to the high-potential wiring VDD is divided by the first resistor element R1 and the second resistance portion 29. For example, assuming that the voltage applied to the high-potential wiring VDD is 5 V, and the electrical resistance value of the first resistor element R1, the second resistance portion 29, and the fuse resistor 22 are respectively 100 k Ω, 10 k Ω, and 100Ω, a voltage of about 4.5 V is applied to the output terminal OUT. That is, a voltage So at a Hi level (a voltage that is higher than the threshold voltage of a transistor forming the transistor portion 10) is applied to the output terminal OUT. In this way, the transistor portion 10 which is a MOSFET for adjusting a current is turned on, and both ends of the corresponding element to be adjusted 2 is maintained at a short-circuit state.

Figure 3:
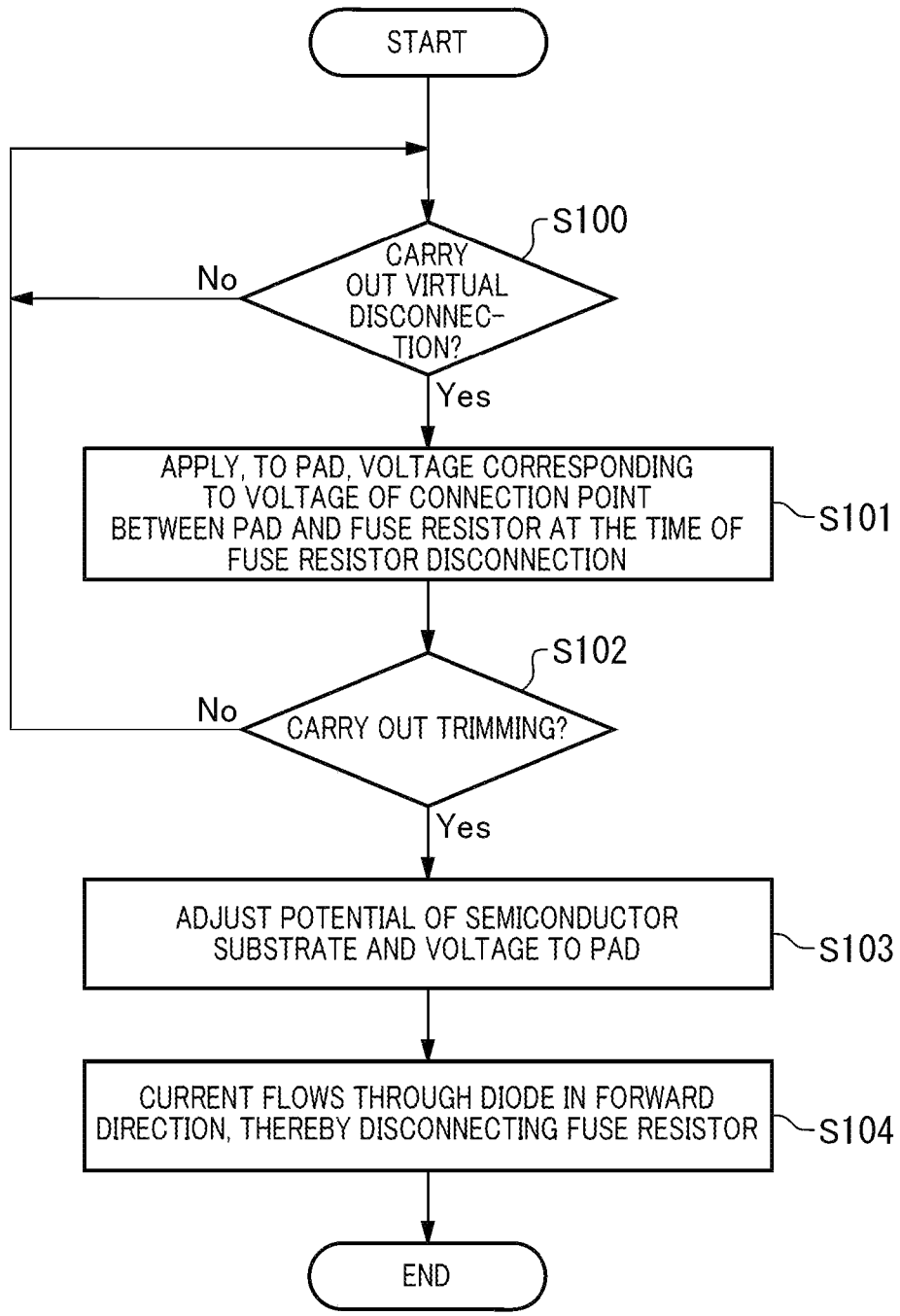
FIG. 3 is a flowchart illustrating one example of a trimming method.

FIG. 3 is a flowchart illustrating one example of a trimming method. A virtual disconnection and a normal disconnection are described with reference to FIG. 3.

[When Virtually Disconnected]

The trimming circuit 100 can carry out virtual disconnection in order to confirm the electrical property of the element to be adjusted 2 after disconnection of the fuse resistor 22. The trimming circuit 100 generates a state in which the fuse resistor 22 is virtually disconnected. In a case where the trimming circuit 100 carries out the virtual disconnection (step S100: YES), the voltage Sp applied to the pad 24 for trimming may be adjusted.

In the trimming circuit 100, an external voltage source or an internal voltage source applies, to the pad 24, a voltage Sp corresponding to the voltage of the connection point 28 at the time when the fuse resistor 22 has been actually connected, in order to generate a virtual disconnection state of the fuse resistor 22 (step S101). In the present example, in a case where the fuse resistor 22 is actually disconnected, the second resistance portion 29 pulls down (dividing voltage) the connection point 28 to ground potential. Therefore, the external voltage source or the internal voltage source may apply a voltage of the ground wiring (a voltage of 0 V, for example) to the pad 24. Step S101 corresponds to a step of applying a predetermined voltage to the pad 24 before the step of causing the forward current to flow through the first diode D1, thereby generating a state in which the fuse resistor 22 is virtually disconnected.

Applying a voltage Sp of 0 V to the pad 24 for trimming causes a voltage So at a Lo level to be applied to the output terminal OUT, similarly to the case in which the fuse resistor 22 is disconnected. In this way, the transistor portion 10 which is a MOSFET for adjusting the current is turned off, and is brought into a state in which both ends of the corresponding element to be adjusted 2 are not short-circuited. That is, virtual disconnection is achieved. At this step, the characteristic of the adjustment target is measured, and the disconnection result of the fuse resistor 22 to be adjusted is evaluated. In a case where the evaluation result does not satisfy a target and another trimming state can be set, the process is branched to the No side at step S102. The transistor portion 10, the fuse resistor 22, and the pad 24 for trimming may each be prepared for a plurality of elements to be adjusted 2, and may be provided in parallel. In this case, each fuse resistor 22 can also be virtually disconnected separately.

[When Normally Disconnected]

Based on the result obtained from virtual disconnection, it may be determined whether to carry out the trimming (step S102). For example, a fuse resistor 22, among the plurality of fuse resistors 22, to be selectively disconnected is determined, such that the resistance value or the current value between the terminal T1 and the terminal T2 falls within a target range.

When carrying out the trimming (step S102: YES), the potential Sc of the first conductivity type semiconductor substrate and the voltage applied to the pad 24 is adjusted, such that a forward current flows through the first diode D1 (step S103). In the present example, the substrate electrode 26 of the semiconductor substrate is set to the ground potential. A voltage that is higher than the voltage applied to the high-potential wiring VDD may be applied to the pad 24 for trimming by an external voltage source or an internal voltage source.

For example, a voltage between 10 V or higher and 30 V or lower is applied to the pad 24 by the external voltage source or the internal voltage source. In this way, a current flows through the fuse resistor 22, and the fuse resistor 22 is disconnected due to Joule heat (step S104). Since the first diode D1 is to be connected in a forward direction, a forward current flows to the substrate electrode 26 through the fuse resistor 22 and the first diode D1. Therefore, a current sufficient to disconnect the fuse resistor 22 can be caused to flow without being influenced by the first resistor element R1 and the second resistance portion 29. In another example, in a case where the fuse resistor 22 is disconnected, the ground potential to which the second resistance portion 29 is connected may be adjusted. For example, in a case where a voltage for disconnecting the fuse resistor 22 is applied to the pad 24, the ground potential may be caused to rise as compared to a case where the voltage is not applied to the pad 24. In this way, a current flowing from the pad 24 to the second resistance portion 29 can be suppressed. In a case where a voltage for disconnecting the fuse resistor 22 is applied to the pad 24, the ground potential may be set to be higher than the substrate potential Sc. The ground potential may be set to the same potential as the high-potential wiring VDD. In this way, it becomes easier for a current to flow through the fuse resistor 22, and the fuse resistor 22 can be readily disconnected.

After the trimming, the trimming circuit 100 is brought into a state in which the fuse resistor 22 is disconnected. In a state in which the fuse resistor 22 is disconnected, the second resistance portion 29 pulls down the output terminal OUT to ground potential. To be specific, a voltage that has been divided by the second resistance portion 29 and the third resistor element R3 is applied to the output terminal OUT. Therefore, a voltage So at the Lo level is applied to the output terminal OUT. In this way, the transistor portion 10 which is a MOSFET for adjusting the current is turned off, and changes into a state in which both ends of the corresponding element to be adjusted 2 are not short-circuited.

Figure 4:
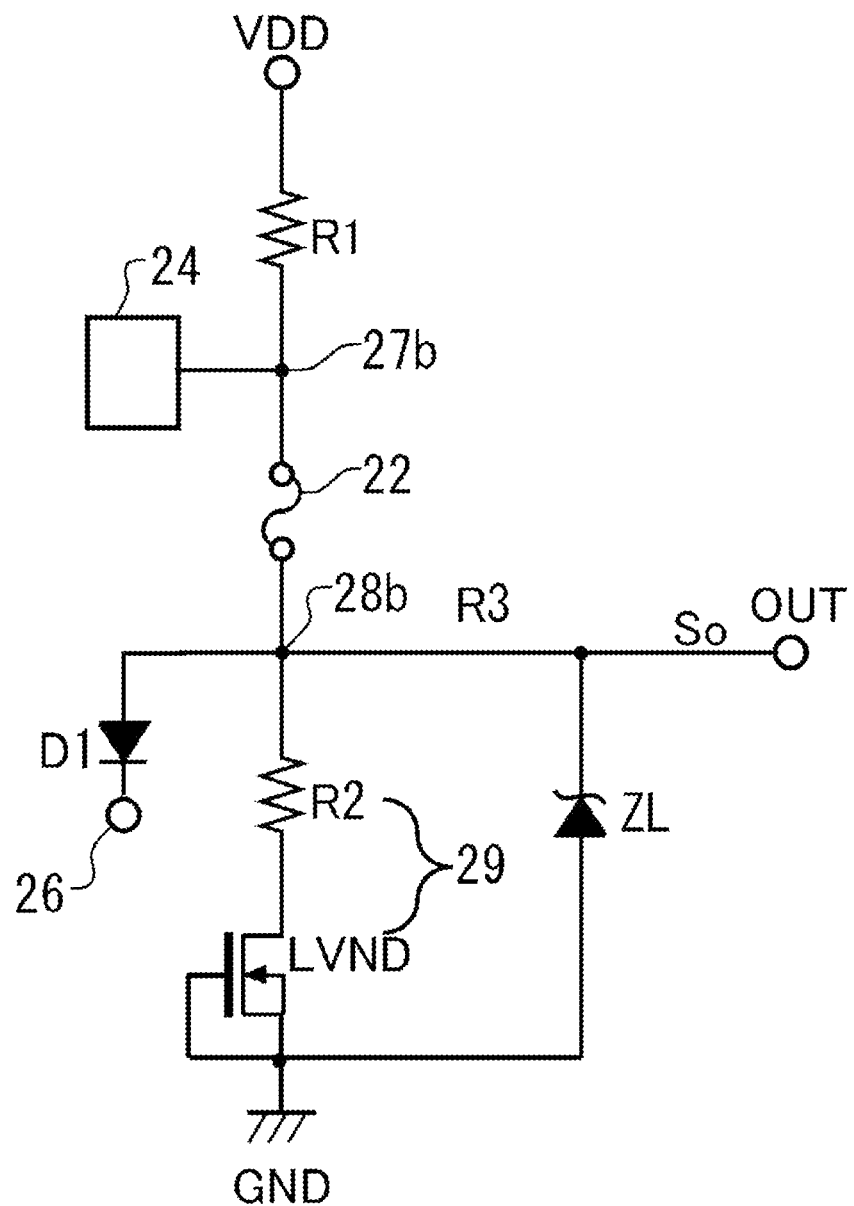
FIG. 4 is a circuit diagram illustrating one example of a body portion 21 of a trimming circuit of a comparative example.

FIG. 4 is a circuit diagram illustrating one example of the body portion 21 of the trimming circuit in a comparative example. In a trimming circuit of the comparative example, the pad 24 for trimming is connected to the connection point 27b between the fuse resistor 22 and the first resistor element R1, and the first diode D1 is connected to the connection point 28b between the fuse resistor 22 and the second resistance portion 29. The output terminal OUT is connected to the connection point 28b between the first diode D1 and the fuse resistor 22. Also in the trimming circuit of the comparative example, expansion of the circuit area can be prevented since the pad 24 for trimming is not each provided on both ends of the fuse resistor 22. However, in the trimming circuit of the comparative example, in a state where the fuse resistor 22 is disconnected, the pad 24 and the output terminal OUT becomes electrically decoupled.

On the other hand, according to the body portion 20 of the trimming circuit 100 of the present invention illustrated in FIG. 2, even in a state where the fuse resistor 22 is disconnected, the pad 24 and the output terminal OUT are electrically connected. Therefore, the pad 24 for trimming can be reutilized for monitoring the voltage at the output terminal OUT. To be specific, even after the trimming, the voltage So at the output terminal OUT can be measured. In addition, the presence or absence of deterioration (leak) of the device due to trimming can be confirmed, and high reliability in the circuit can be ensured.

Figure 5:
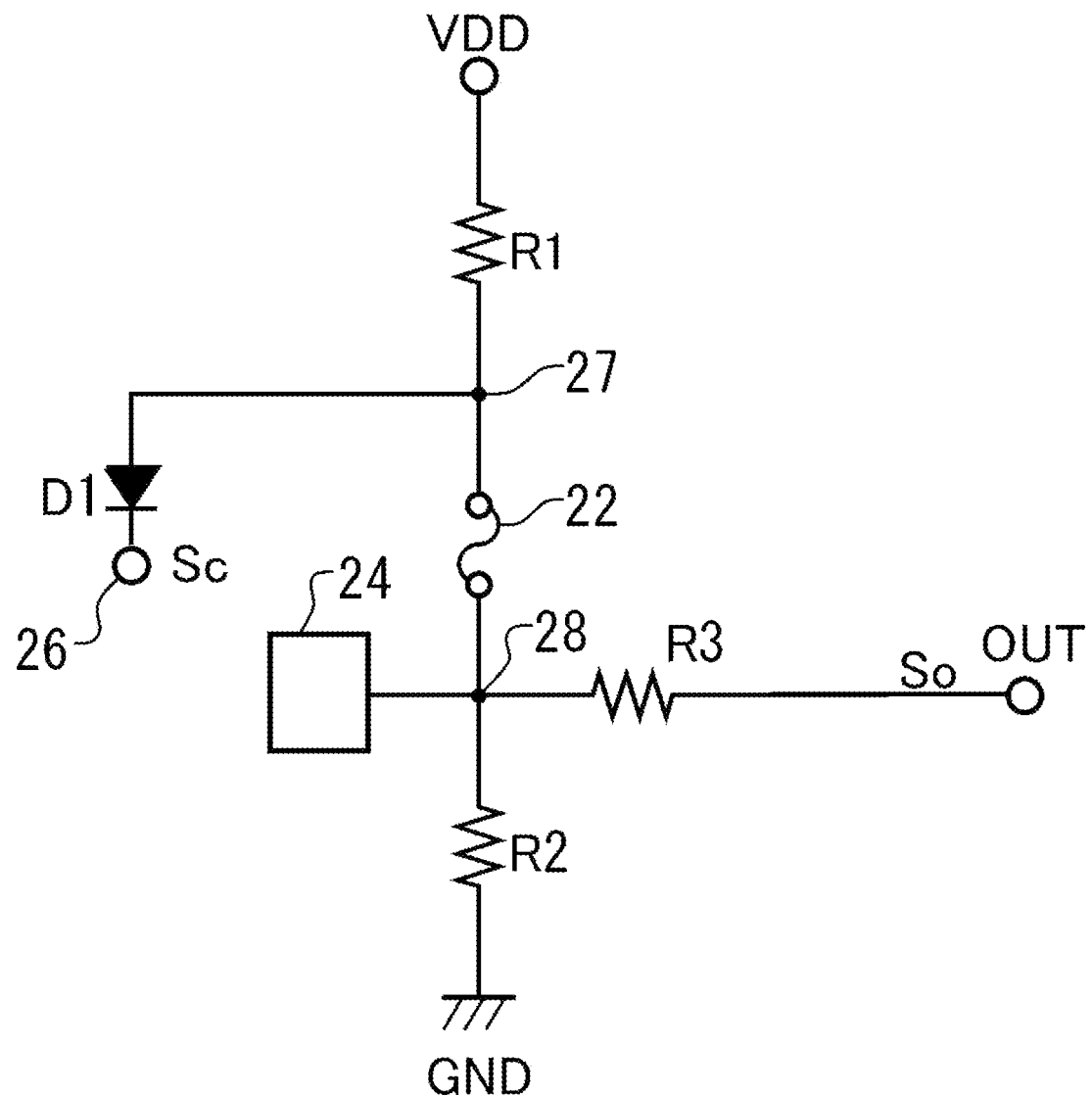
FIG. 5 is a circuit diagram illustrating another example of the body portion 20 in the trimming circuit 100.

Note that, the protection diode ZL can be omitted. FIG. 5 is a circuit diagram illustrating another example of the body portion 20 in the trimming circuit 100. The body portion 20 illustrated in FIG. 5 has a similar structure as the body portion 20 illustrated in FIG. 2, except for the omission of the protection diode ZL.

Figure 6:
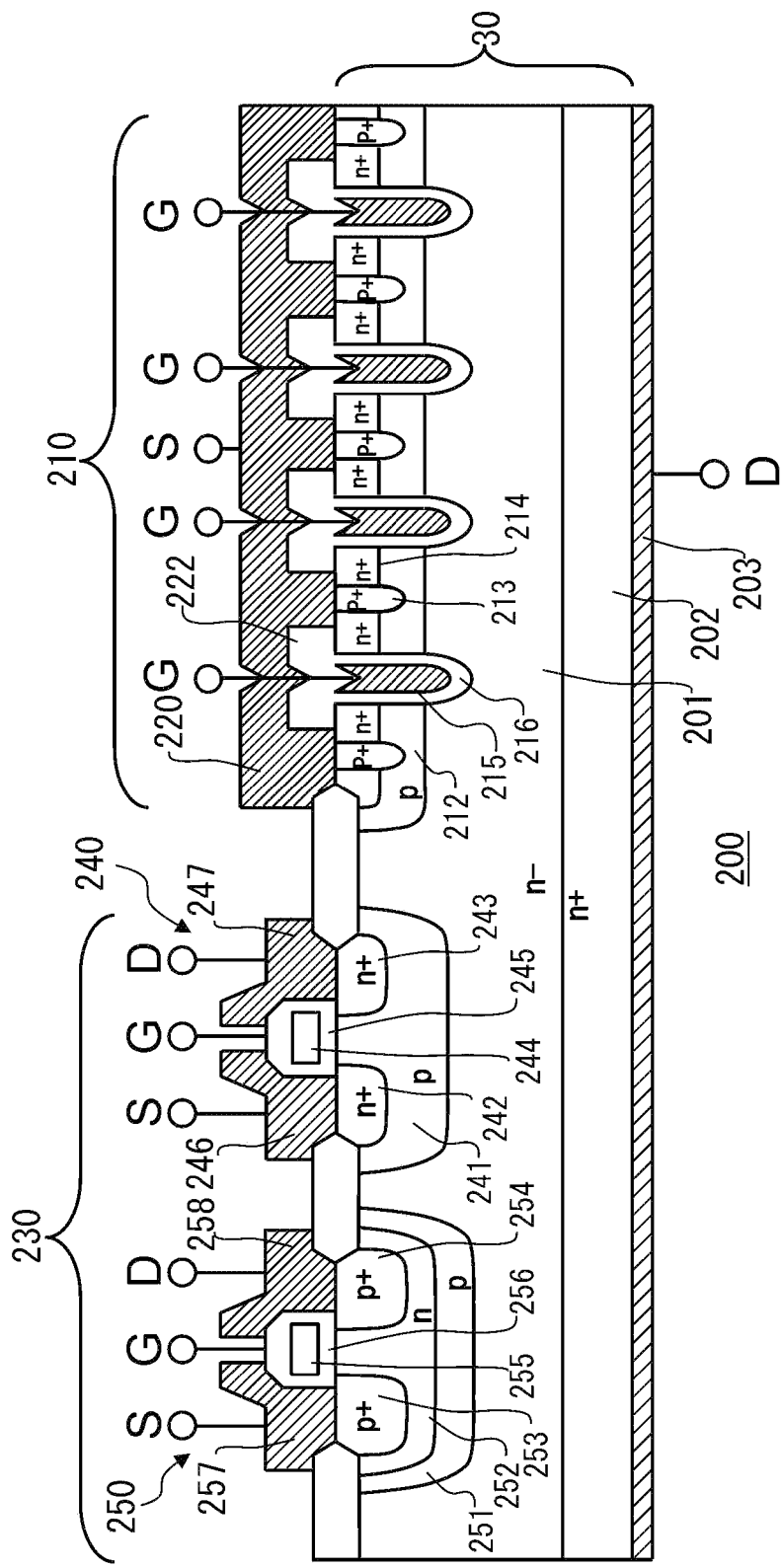
FIG. 6 is one example of a semiconductor device 200 to which the trimming circuit 100 is applied.

FIG. 6 is one example of a semiconductor device 200 to which the trimming circuit 100 is applied. The trimming circuit 100 of the present embodiment can be applied to various types of semiconductor devices 200. In one example, the semiconductor device 200 has an output stage circuit portion 210 and a control circuit portion 230 formed on a same semiconductor substrate 30. In one example, the semiconductor device 200 is an IPS (intelligent power switch).

The output stage circuit portion 210 may include a trench gate type power semiconductor. The output stage circuit portion 210 may be a vertical MOSFET (metal-oxide-semiconductor field-effect transistor), or may be an IGBT (insulated gate bipolar transistor). In the present example, the output stage circuit portion 210 is a vertical MOSFET having a trench gate.

In the present example, the conductivity type of the semiconductor substrate 30 is an n-type. The semiconductor substrate 30 includes an n-type drift layer 201. On one surface of the semiconductor substrate 30 (the back surface in the figure), an n+-type layer is formed as a contact layer 202 by impurity diffusion or the like. A drain electrode 203 is formed on the contact layer 202. The drain electrode 203 is formed of an electrically conductive material such as metal. Note that, of the main surfaces of the semiconductor substrate 30, the main surface on which the drain electrode 203 is formed is referred to as the back surface, and the main surface on the opposite side of the back surface is referred to as the front surface.

A p-type base layer 212 is formed on the front surface, which is the other surface of the semiconductor substrate 30. An n+-type layer 214 is formed surrounding the p+-type layer 213 on the front surface of the p-type base layer 212. The trench gate is formed on the semiconductor substrate 30. The trench gate penetrates the p-type base layer 212 to reach to the n-type drift layer 201. The trench gate includes a conductive section 215 filled in the trench and an insulating film 216 for electrically decoupling the conductive section 215 from the semiconductor substrate 30. A source electrode 220 is formed to cover the p+-type layer 213. The source electrode 220 is formed of an electrically conductive material. An insulating film 222 is formed above the trench gate. The insulating film 222 provides insulation between the trench gate and the source electrode 220.

Note that, in the present invention, "n" displayed as the component indicates an element having electron as a majority carrier, "p" indicates an element having positive hole as a majority carrier, "+" indicates a relatively high impurity concentration, and "−" indicates a relatively low impurity concentration.

The control circuit portion 230 may include a CMOS circuit portion having combined an n-channel MOS transistor 240 and a p-channel MOS transistor 250 on the front surface side of the semiconductor substrate 30. The n-channel MOS transistor 240 includes a p-well region 241 formed in an n-type semiconductor substrate 30. A source region 242 and a drain region 243, which are each an n+ type, are formed inside the p-well region 241. A source electrode 246 is connected to the source region 242 and a drain electrode 247 is connected to the drain region 243. The source electrode 246 and the drain electrode 247 are formed of an electrically conductive material such as metal. A gate electrode 244 is provided via a gate insulating film 245 on the front surface of the semiconductor substrate 30. A source region 242 is provided on one side of the gate electrode 244, and to drain region 243 is provided on the other side of the gate electrode 244.

The p-channel MOS transistor 250 includes a p-well region 251 formed in an n-type semiconductor substrate 30, and includes an n-well region 252 inside the p-well region 251. A source region 253 and a drain region 254, which are each a p+-type, are formed inside the n-well region 252. A source electrode 257 is connected to the source region 253, and a drain electrode 258 is connected to the drain region 254. A gate electrode 255 is provided via a gate insulating film 256 on the front surface of the semiconductor substrate 30.

A trimming circuit 100 which is an embodiment of the present invention may be configured on the semiconductor substrate 30 in the above-mentioned semiconductor device 200. The trimming circuit 100 may be used to set various types of voltage in the semiconductor device 200.

Figure 7:
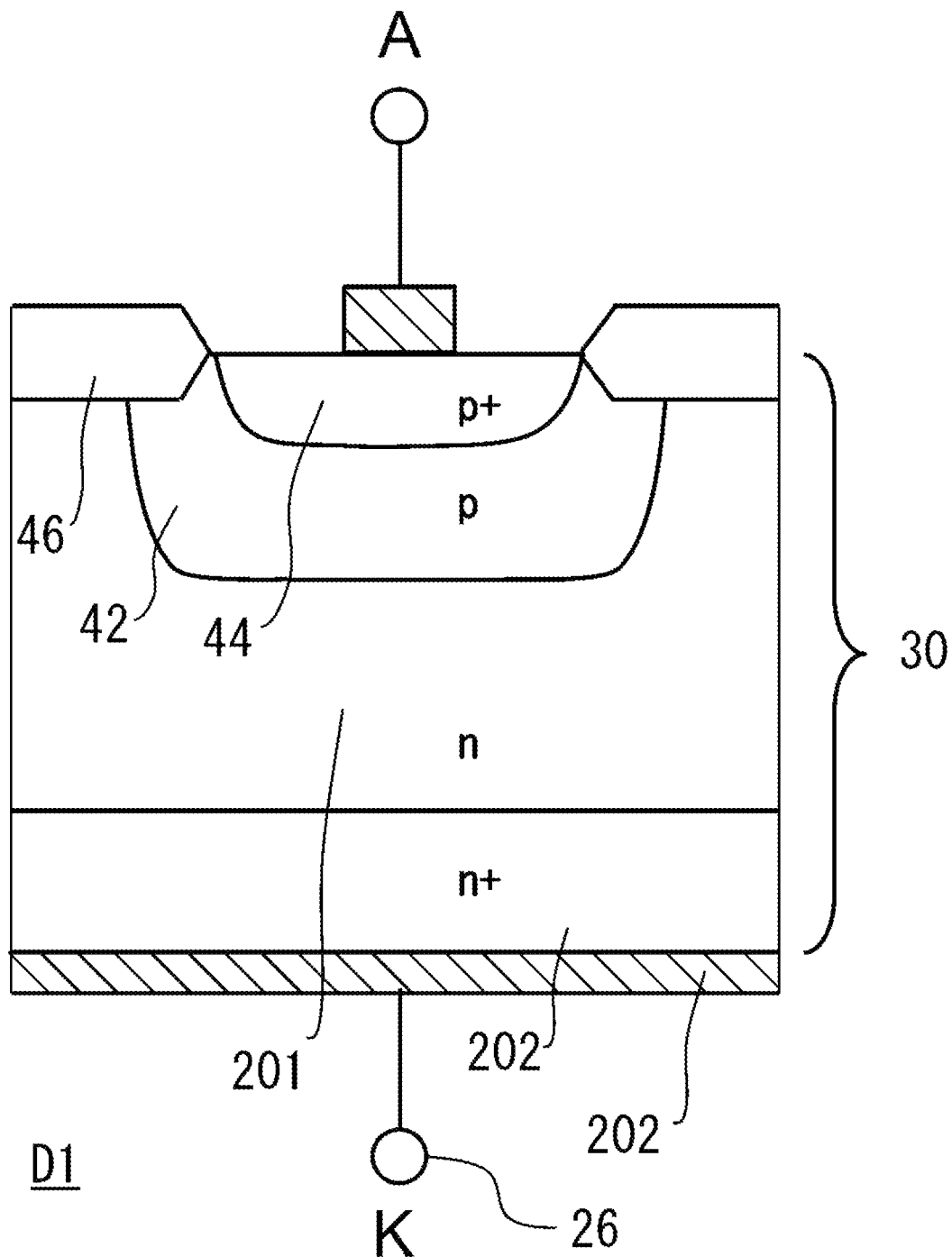
FIG. 7 is a cross-sectional view illustrating one example of a vertical diode used in the trimming circuit 100.

FIG. 7 is a cross-sectional view illustrating one example of a vertical diode used in the trimming circuit 100. As illustrated in FIG. 7, in the trimming circuit 100, the first diode D1 is formed on the semiconductor substrate 30. In the present example, the semiconductor substrate 30 is a n-type semiconductor substrate 30. As illustrated in FIG. 7, a first semiconductor region 42 of a second conductivity type is formed on the front surface side of the semiconductor substrate 30. In one example, the first semiconductor region 42 is a p-type diffusion layer formed on the n-type semiconductor substrate 30. A p-n junction is formed by the first semiconductor region 42 and the semiconductor substrate 30. This p-n junction functions as the first diode D1.

The first diode D1 may be a vertical diode. Herein, a vertical diode indicates a diode through which current flows in the thickness direction of the semiconductor substrate 30. In the present example, the anode is arranged on the front surface side of the semiconductor substrate 30, and the cathode is arranged on the back surface side of the semiconductor substrate 30. A substrate electrode 26 is connected to the cathode. However, even when it is a vertical diode, the substrate electrode 26 may be provided on the front surface side of the semiconductor substrate 30, since the potential of the semiconductor substrate 30 may be fixed.

A second semiconductor region 44 of a second conductivity type may be formed in a part of the first semiconductor region 42. The second semiconductor region 44 has a higher impurity concentration than the first semiconductor region 42. In one example, the second semiconductor region 44 is a p+ diffusion layer. An insulating film 46 is partially provided on the semiconductor substrate 30. The insulating film 46 may be a LOCOS oxide film.

Figure 8:
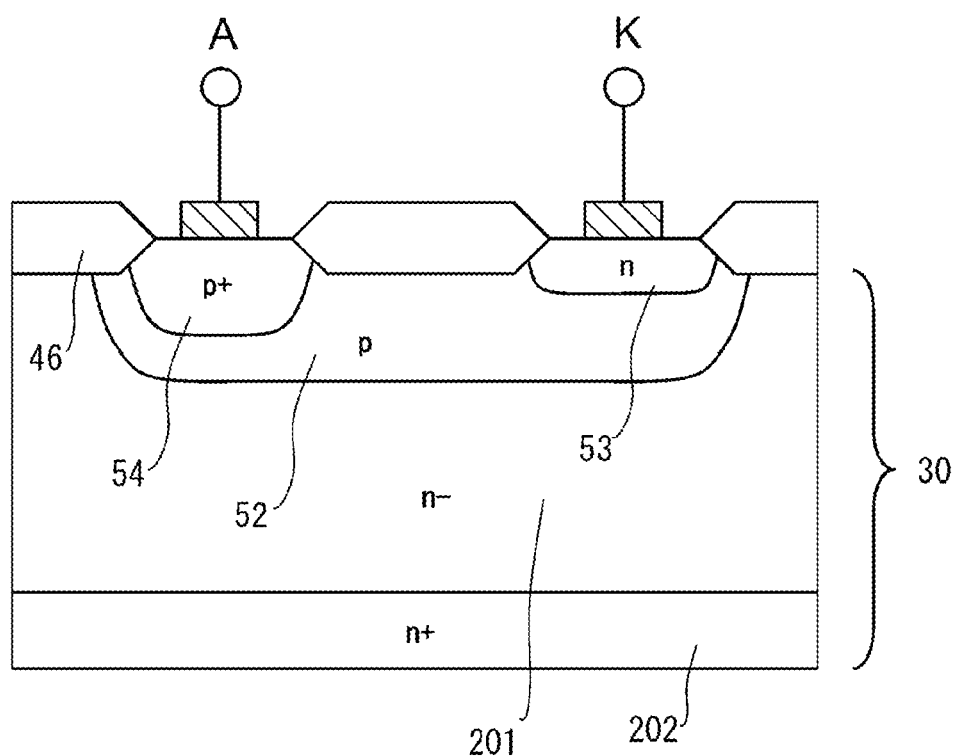
FIG. 8 is a cross-sectional view illustrating one example of a diffusion diode as a comparative example.

FIG. 8 is a cross-sectional view illustrating one example of a diffusion diode as a comparative example. The diffusion diode includes a p-well region 52 in the semiconductor substrate 30. An n-type cathode region 53 and a p+-type anode region 54 are formed in the p-well region 52. In a case where such a diffusion diode is used as a first diode D1, the n-type drift layer 201, the p-well region 52, and n-type cathode region 53 of the semiconductor substrate 30 act as vertical npn-parasitic transistor.

Figure 9:
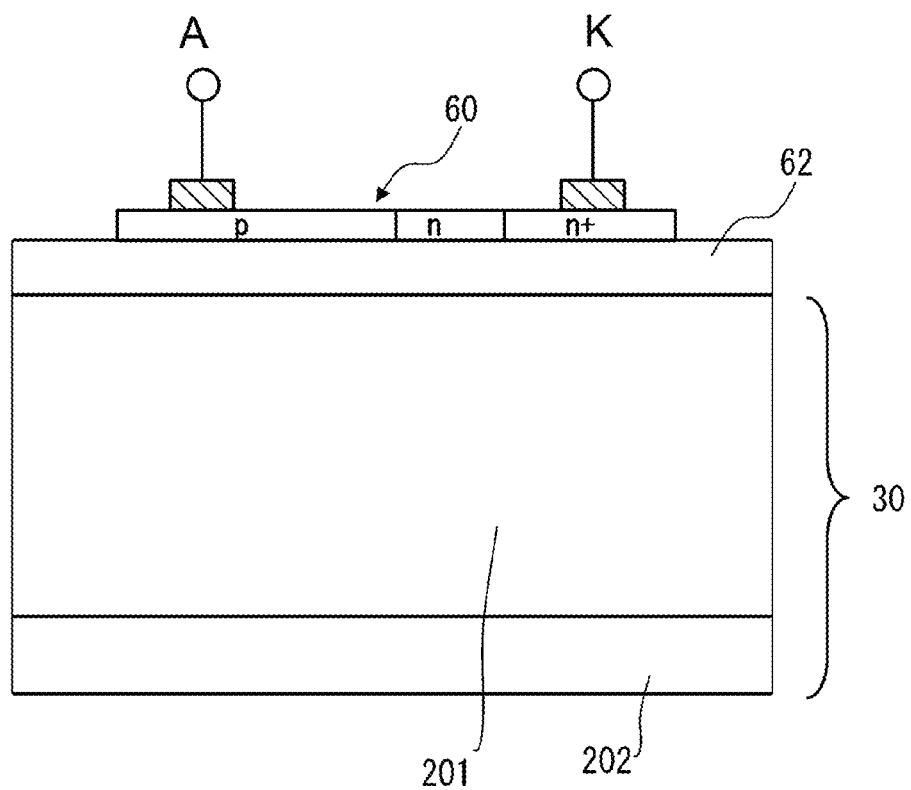
FIG. 9 is a cross-sectional view illustrating one example of a polysilicon diode as a comparative example.

FIG. 9 is a cross-sectional view illustrating one example of a polysilicon diode as a comparative example. The polysilicon diode includes a polysilicon 60 arranged via an insulating layer 62 on the semiconductor substrate 30. The polysilicon 60 may be doped with impurities, thereby forming a p-type region, an n-type region, and an n+-type region. An anode electrode is formed in the p-type region, and a cathode electrode is formed in the n+-type region. In such a polysilicon diode, the operation resistance becomes large. Therefore, in order to reduce the resistance value, it is necessary to expand the area occupied by the polysilicon 60. Therefore, it is difficult to prevent the expansion of the circuit area.

In a case where the vertical diode described above using FIG. 7 is used as the first diode D1, there is no parasitic operation, and the operation resistance is smaller as compared to the polysilicon diode. Therefore, it is desirable to use a vertical diode as the first diode D1 through which current flows in a forward direction in order to disconnect the fuse resistor 22.

Figure 10:
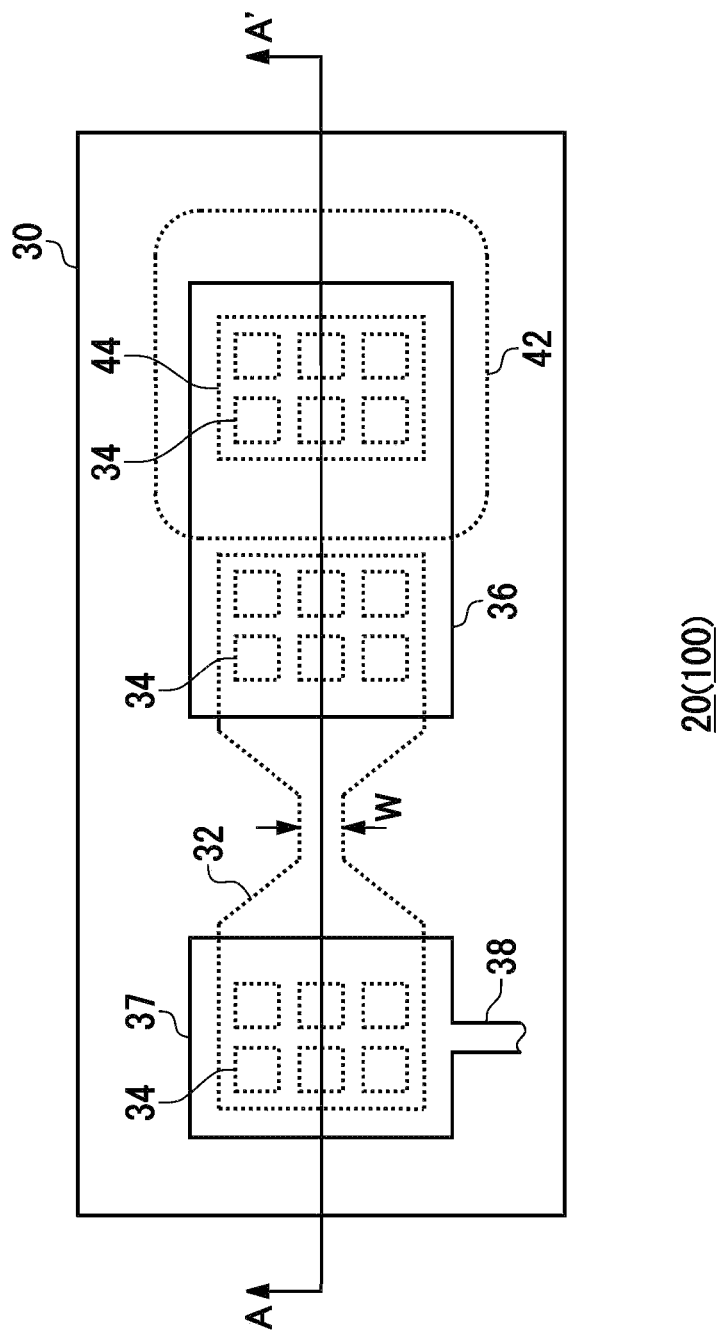
FIG. 10 is a plan view illustrating an exemplary configuration of the body portion 20.
Figure 11:
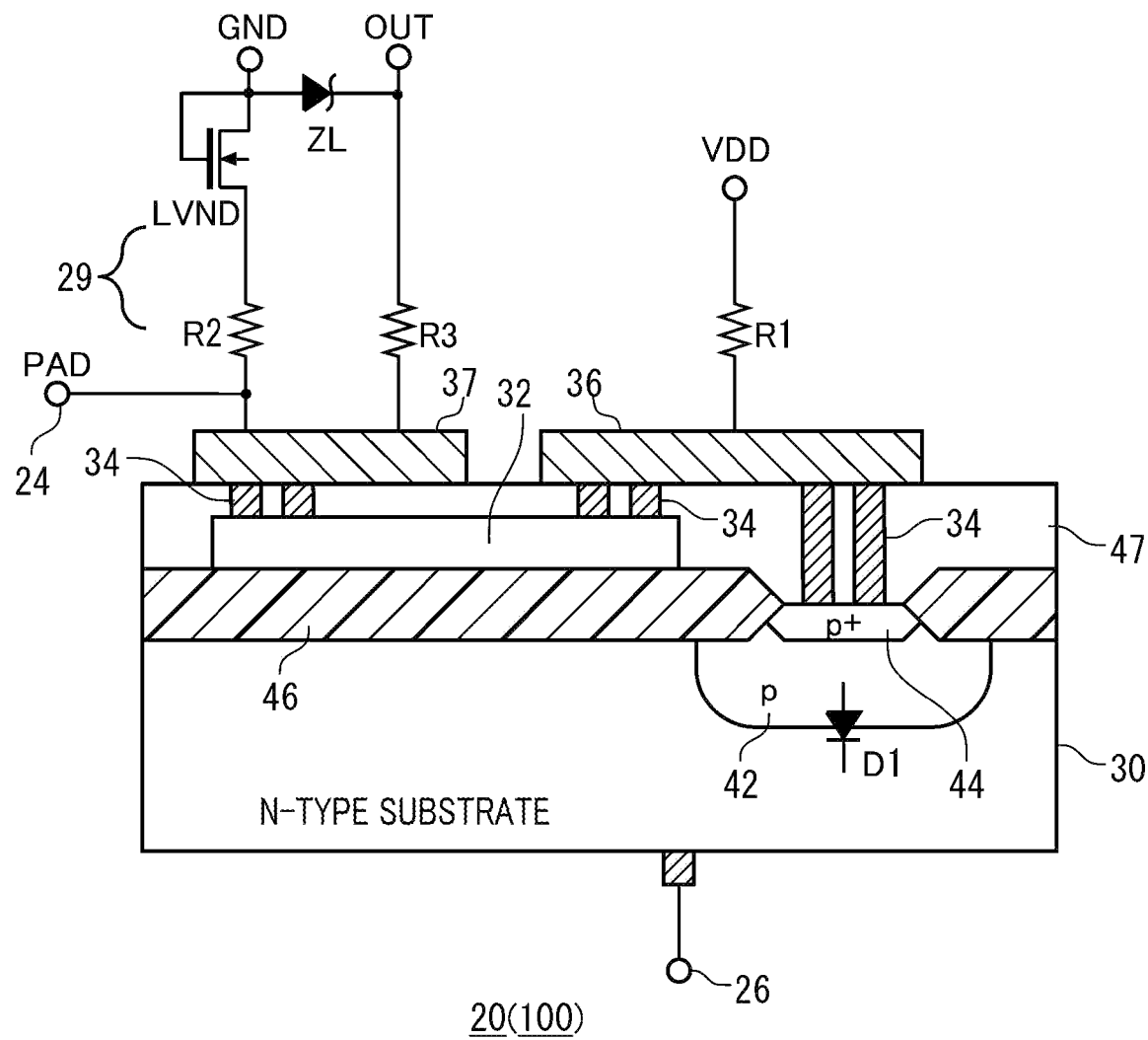
FIG. 11 is a cross-sectional view illustrating an exemplary configuration of the body portion 20.

FIG. 10 is a plan view illustrating an exemplary configuration of the body portion 20. FIG. 11 is a cross-sectional view illustrating an exemplary configuration of the body portion 20. FIG. 11 illustrates a cross section of the body portion 20 along the line A-A' in FIG. 10. Note that, the first resistor element R1, the second resistance portion 29, the third resistor element R3, and the protection diode ZL are omitted in FIG. 10 for convenience of description, and only the relation of electrical connection thereof is shown with circuit symbols in FIG. 11. Note that the transistor portion 10, the first resistor element R1, the second resistance portion 29, the third resistor element R3, and the protection diode ZL may be formed on the actual semiconductor substrate 30.

As illustrated in FIG. 10, in the trimming circuit 100, the first diode D1 and the fuse resistor 22 are formed on the semiconductor substrate 30. The semiconductor substrate 30 is a semiconductor substrate 30 of a first conductivity type. The first diode D1 is a vertical diode described in FIG. 7.

A contact portion 34 is connected to the second semiconductor region 44 of a second conductivity type. The contact portion 34 may be formed of a conductive material. A polysilicon layer 32 is provided via the insulating film 46 on the semiconductor substrate 30. The fuse resistor 22 is formed by the polysilicon layer 32. The fuse resistor 22 is formed having a narrow width in the center portion to facilitate its disconnection.

As illustrated in FIG. 11, one end of the fuse resistor 22 is connected to metal wiring 36 via the contact portion 34. In the first diode D1, in a region in which the second semiconductor region 44 is formed, the insulating film 46 is partially removed and the second semiconductor region 44 is partially exposed. The second semiconductor region 44 is connected to the metal wiring 36 via the contact portion 34. The metal wiring 36 and the contact portion 34 electrically connect the anode of the first diode D1 and the fuse resistor 22, and functions as the connection point 27 illustrated in FIG. 2. The metal wiring 36 may be connected to the high-potential wiring VDD via the first resistor element R1.

Another end of the fuse resistor 22 is connected to the metal wiring 37 via the contact portion 34. The metal wiring 37 functions as the connection point 28 connecting the fuse resistor 22 to the pad 24 and the second resistance portion 29. The metal wiring 37 may have a coupling portion 38 that couples to the pad 24 for trimming, as illustrated in FIG. 10. The metal wiring 37 may be electrically connected to the output terminal OUT via the third resistor element R3. In addition, the metal wiring 37 may be electrically connected to the ground potential GND via the second resistance portion 29. Note that, an interlayer dielectric film 47 may be formed between the polysilicon layer 32, the second semiconductor region 44, and the insulating film 46, and the metal wiring 36, 37. That is, the metal wiring 36 and the metal wiring 37 may be formed of the interlayer dielectric film 47. In this case, the contact portion 34 is formed to pass through an opening in the interlayer dielectric film 47.

According to the trimming circuit 100 of the present example, virtual disconnection can be achieved, in which the electrical property of the element to be adjusted after disconnection of the fuse resistor 22 is confirmed before disconnecting the fuse resistor 22. Although the pad 24 for trimming connected to one end of the fuse resistor 22 is also necessary in the present example, it is not necessary to provide an external terminal dedicated for trimming, since the substrate electrode 26 such as the existing back surface electrode can be used as a terminal on the other end side of the fuse resistor 22. In addition, it is not necessary to provide a resistance bypass circuit that can resist a large current melting the fuse resistor 22. Therefore, a trimming circuit 100 realizing both miniaturization and a virtual disconnection function as compared to a conventional one can be achieved.

According to the trimming circuit 100 of the present example, the first diode D1 includes a first semiconductor region 42 of a second conductivity type formed on the semiconductor substrate 30 of a first conductivity type. The first diode D1 in the present example may not be formed by the polysilicon layer 32, and may be configured by a impurity diffusion layer formed on the semiconductor substrate 30. Therefore, the fuse resistor 22 and the first diode D1 may be formed to be laminated, since they are not formed on the same layer. In this way, the region on the semiconductor substrate 30 can be utilized efficiently, thereby achieving miniaturization of the trimming circuit 100.

According to the trimming circuit 100 of the present example, even when the fuse resistor 22 is disconnected, the pad 24 and the output terminal OUT are electrically connected via the metal wiring 37 and the third resistor element R3. Therefore, the pad 24 for trimming can be reutilized for monitoring the voltage in the output terminal OUT. To be specific, even after the trimming, the voltage So at the output terminal OUT can be measured. In addition, the presence or absence of deterioration (leak) caused to the element due to trimming can be confirmed, and high reliability in the circuit can be ensured.

Figure 12:
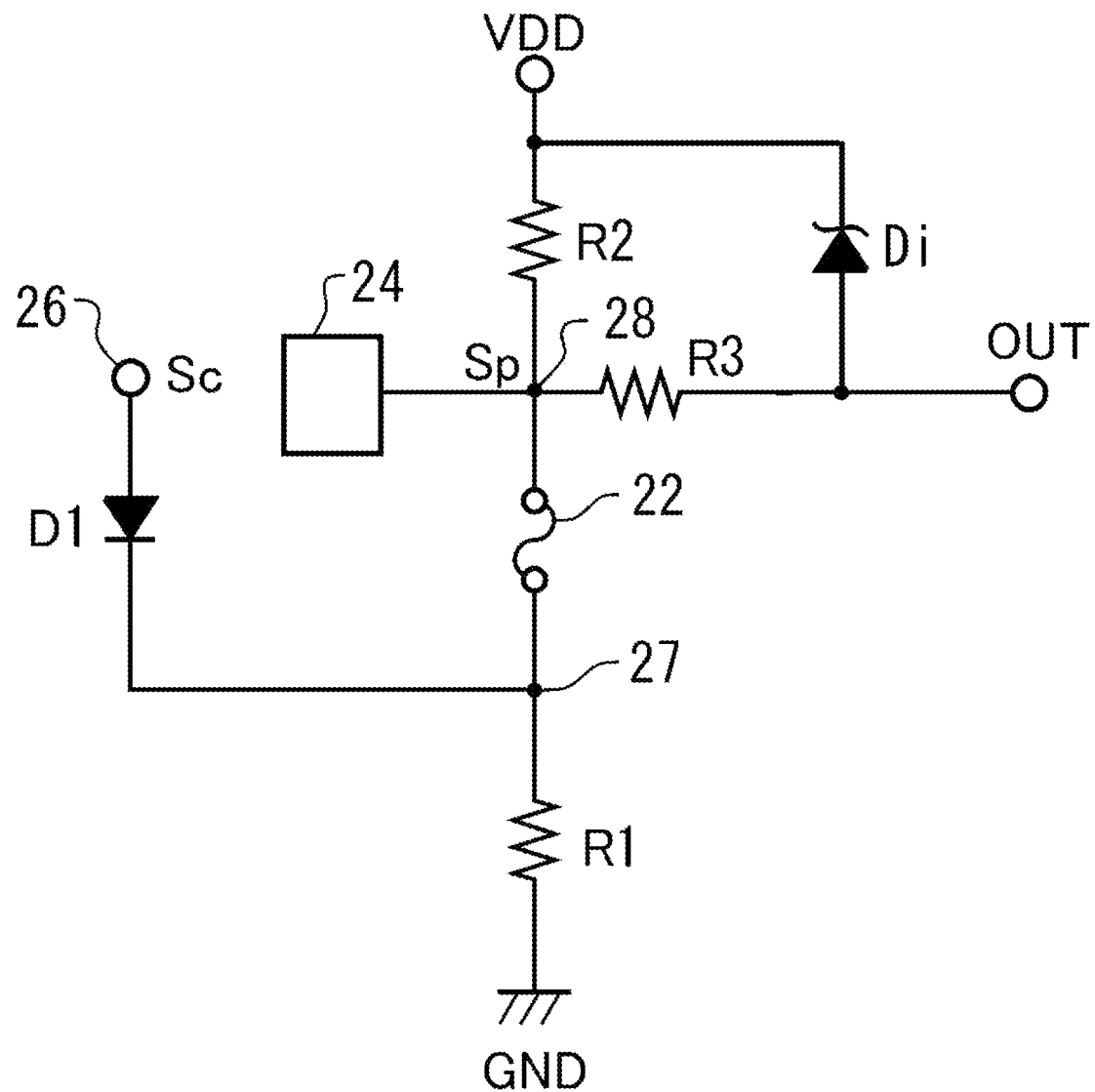
FIG. 12 is a circuit diagram illustrating one example of the body portion 20 using a p-type semiconductor substrate 30.

In the above-mentioned example, a case in which the body portion 20 of the trimming circuit 100 is configured using an n-type semiconductor substrate 30 has been described. However, the trimming circuit 100 can be achieved by using a p-type semiconductor substrate 30 as the semiconductor substrate 30. FIG. 12 is a circuit diagram illustrating one example of the body portion 20 using a p-type semiconductor substrate 30.

In the present example, the first conductivity type is a p-type, and the second conductivity type is an n-type. Therefore, the body portion 20 of the present example has a configuration in which the n-type semiconductor substrate 30 is changed to a p-type semiconductor substrate 30, the p-type first semiconductor region 42 is changed to an n-type semiconductor region, and the p+-type second semiconductor region 44 is changed to an n+ type semiconductor region from the configuration illustrated in FIG. 7, FIG. 10, and FIG. 11. Due to the orientation of the p-n junction, the substrate electrode 26 side becomes the anode. Other components are similar to those illustrated in FIG. 7, FIG. 10, and FIG. 11.

The trimming circuit 100 of the present example includes a fuse resistor 22, a pad 24 for trimming, a first diode D1, a first resistor element R1, a second resistor element R2, a third resistor element R3, and a protection diode Di. One end of the fuse resistor 22 is connected to the pad 24.

Another end of the fuse resistor 22 is connected to one end of the first diode D1. In the present example, another end of the fuse resistor 22 is connected to a cathode of the first diode D1.

One end of the first resistor element R1 is connected to a connection point 27 between one end of the fuse resistor 22 and the cathode of the first diode D1. Another end of the first resistor element R1 is connected to first potential. In the example of FIG. 12, the first potential may be ground potential GND. One end of the second resistor element R2 is connected to a connection point 28 between the fuse resistor 22 and the pad 24. Another end of the second resistor element R2 is connected to second potential. In the example of FIG. 12, the second potential is potential of the high-potential wiring. In the present example, the output terminal OUT is also electrically connected to the connection point 28 between the fuse resistor 22 and the pad 24. In the present example, the output terminal OUT is electrically connected to the connection point 28 via the third resistor element R3. The output terminal OUT outputs a voltage according to the presence or absence of disconnection of the fuse resistor 22.

Figure 13:
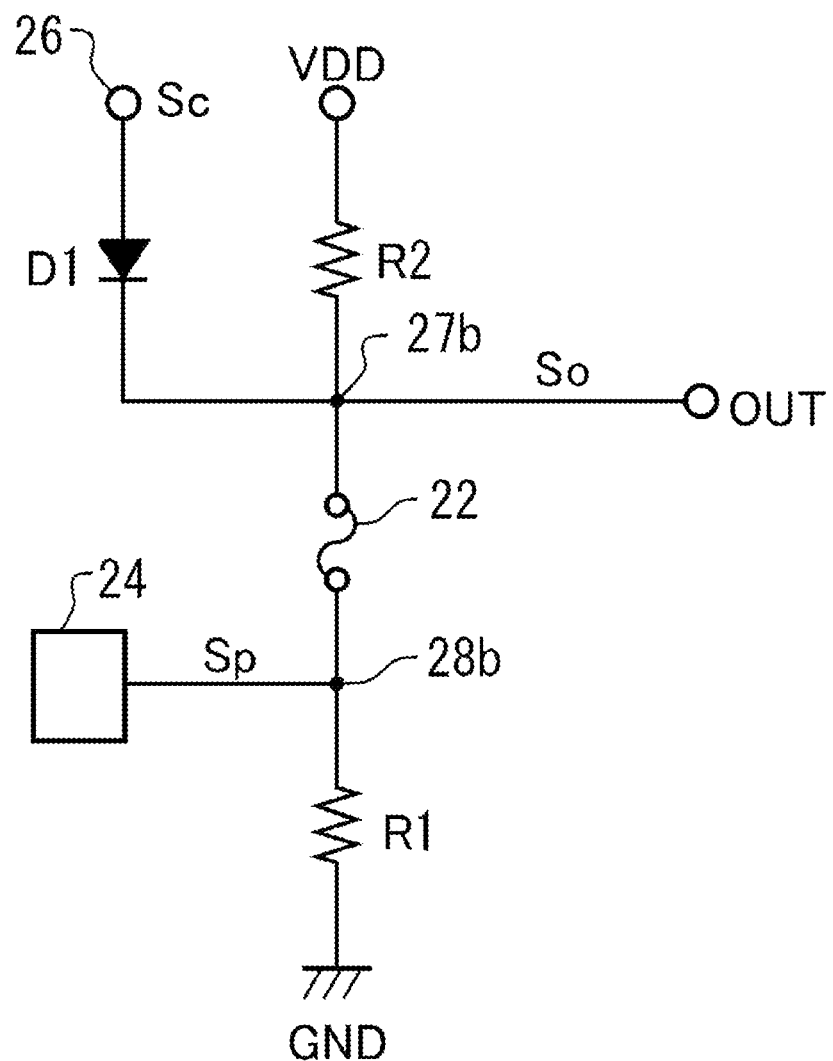
FIG. 13 is a circuit diagram illustrating a comparative example of the body portion 20 using a p-type semiconductor substrate 30.

FIG. 13 is a circuit diagram illustrating a comparative example of the body portion 20 using a p-type semiconductor substrate 30. In a trimming circuit of the comparative example, the pad 24 for trimming is connected to one end of the fuse resistor 22, and the first diode D1 is connected to the other end of the fuse resistor 22. The output terminal OUT is connected to a connection point 27b between the first diode D1 and the fuse resistor. Also in the trimming circuit of the comparative example, expansion of the circuit area can be prevented since the pad 24 for trimming is provided only on one end of the fuse resistor 22. However, in the trimming circuit of the comparative example, in a state where the fuse resistor 22 is disconnected, the pad 24 and the output terminal OUT becomes electrically decoupled.

On the other hand, according to the body portion 20 of the trimming circuit 100 of the present invention illustrated in FIG. 12, even in a state where the fuse resistor 22 is disconnected, the pad 24 and the output terminal OUT are electrically connected. Therefore, the pad 24 for trimming can be reutilized for monitoring the voltage at the output terminal OUT. To be specific, even after the trimming, the voltage So at the output terminal OUT can be measured. In addition, the presence or absence of deterioration (leak) caused to the element due to trimming can be confirmed, and high reliability in the circuit can be ensured.

Also according to the trimming circuit 100 of the present example, virtual disconnection can be achieved, in which the electrical property of the element to be adjusted after disconnection of the fuse resistor 22 is confirmed before disconnecting the fuse resistor 22. In the trimming circuit 100, an external voltage source or an internal voltage source applies, to the pad 24, a voltage Sp corresponding to the voltage of the connection point 28 between the pad 24 and the fuse resistor 22 at the time of disconnection of the fuse resistor 22. In the present example, in a case where the fuse resistor 22 is actually disconnected, the first resistor element R1 pulls up (dividing voltage) the connection point 28 to the potential of the high-potential wiring VDD. Therefore, the external voltage source or the internal voltage source may apply the voltage of the high-potential wiring VDD to the pad 24.

Also in the trimming circuit 100 illustrated in FIG. 12, the substrate electrode 26 such as the existing back surface electrode can be utilized as the control terminal of the fuse resistor 22, and the number of external terminals dedicated for trimming can be reduced. In addition, it becomes unnecessary to provide a resistance bypass circuit that can resist a large current that melts the fuse resistor 22. Therefore, a trimming circuit 100 having a small circuit area and capable of virtual disconnection can be achieved. In addition, according to the body portion 20 of the trimming circuit 100 illustrated in FIG. 12, even in a state where the fuse resistor 22 is disconnected, the pad 24 and the output terminal OUT are electrically connected. Therefore, the pad 24 for trimming can be reutilized for monitoring the voltage at the output terminal OUT.

Figure 14:
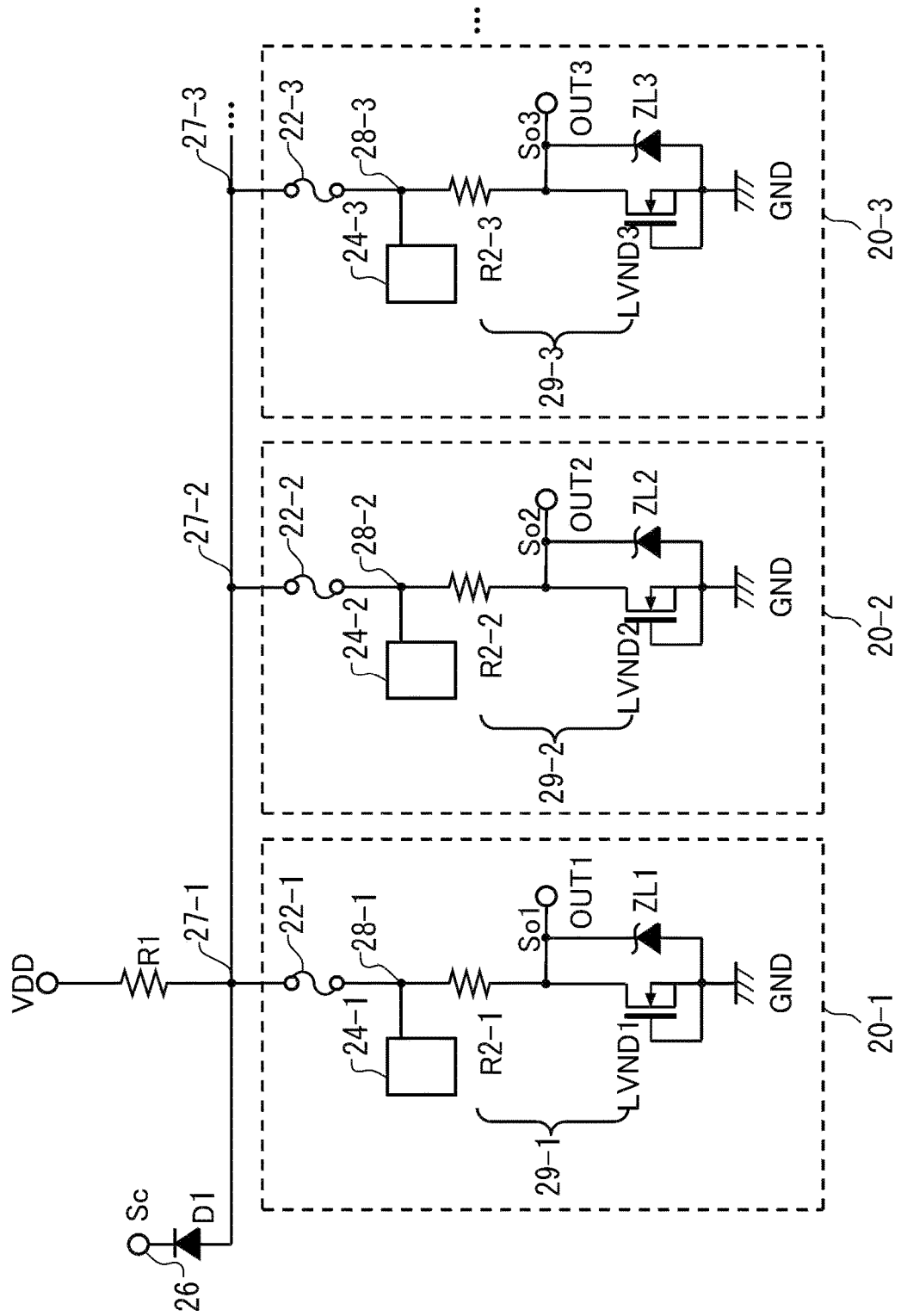
FIG. 14 illustrates another exemplary configuration of the trimming circuit 100.

FIG. 14 illustrates another exemplary configuration of the trimming circuit 100. The trimming circuit 100 of the present example includes a plurality of body portions 20. The trimming circuit 100 of the present example includes the body portions 20-1, 20-2, 20-3, and so on. Herein, the kth body portion 20 may be referred to as the body portion 20-$k$. In addition, in each figure, a branch number of k is added to the reference numeral of each components in the body portion 20-$k$. Each of the body portions 20 is provided corresponding to the element to be adjusted 2. Each of the body portions 20 may be connected to the gate of the transistor portion 10 illustrated in FIG. 1.

Each of the body portions 20 has a structure similar to the body portion 20 of any of the aspects described in FIG. 1 to FIG. 13. In FIG. 14, each of the body portions 20 has a structure similar to the body portion 20 illustrated in FIG. 2. Note that, in FIG. 14, illustration of the third resistor element R3 is omitted. The body portion 20 in each example may or may not include the third resistor element R3. In addition, in FIG. 14, the second resistor element R2 is arranged between the pad 24 and the output terminal OUT. In the body portion 20 of each example, the second resistor element R2 may be arranged between the pad 24 and the output terminal OUT similarly to FIG. 14, or may be arranged between the pad 24 and the resistor element LVND similarly to FIG. 2.

In the trimming circuit 100 of the present example, the first diode D1 is provided in common to the plurality of body portions 20. That is, a separate first diode D1 is not provided for each of the body portions 20. The common first diode D1 is connected to the fuse resistor 22 of each of the body portions 20. The first diode D1 of the present example has its anode connected to a plurality of fuse resistors 22.

The fuse resistor 22-$k$ of the present example has one end connected to the pad 24-$k$ and another end connected to the first diode D1. In the present example, The output terminal OUTk and a resistor element LVNDk is connected via the second resistor element R2-1 to said one end of the fuse resistor 22-$k$.

In addition, the first resistor element R1 is connected to said another end of the fuse resistor 22-$k$. In the present example, the first resistor element R1 is also provided in common to the plurality of body portions 20. One end of the first resistor element R1 is connected to the first diode D1, and the other end is connected to the high-potential wiring VDD. In the present example, a connection point 27-$k$ is provided for each of the body portions 20-$k$. The anode of the first diode D1, one end of the first resistor element R1, and the other end of the fuse resistor 22-$k$ are connected to the connection point 27-$k$.

The scale of the device can be reduced by providing a first diode D1 in common to the plurality of body portions 20. In addition, the scale of the device can be reduced by providing a first resistor element R1 in common to the plurality of body portions 20.

In the present example, one fuse resistor 22 to be disconnected is selected at a time, and a predetermined high voltage is applied, in order, to a pad 24-$k$ corresponding to the fuse resistor 22-$k$ to be disconnected. In each of the body portions 20, the operation of connecting the fuse resistor 22 is similar to the example of FIG. 3. As described above, said high voltage is a voltage that is higher than the voltage applied to the high-potential wiring VDD. Ground potential may be applied to the unselected pads 24, for example.

In addition, the ground potential applied to the selected body portion 20 of which the fuse resistor 22 is to be disconnected may be changed. For example, in a case where the fuse resistor 22-$k$ is disconnected, the ground potential applied to the body portion 20-$k$ is caused to rise. The ground potential of the body portion 20-$k$ may be controlled to be the same potential as the potential applied to the pad 24-$k$. In this way, the a current flowing from the pad 24-$k$ to the second resistance portion 29-$k$ can be suppressed.

In addition, in a case where virtual disconnection is set, a voltage for the virtual disconnection may be applied in parallel to each pad 24. That is, each of the body portions 20 can be set to be in a virtual disconnection state in parallel. In addition, some of the body portions 20 may be selectively set to be in a virtual disconnection state.

In addition, the resistance value of the first resistor element R1 and the second resistor element R2 may be sufficiently smaller than the resistance value of the resistor element LVND. By increasing the resistance value of the resistor element LVND, the current that flows to the body portion 20 can be reduced.

Figure 15:
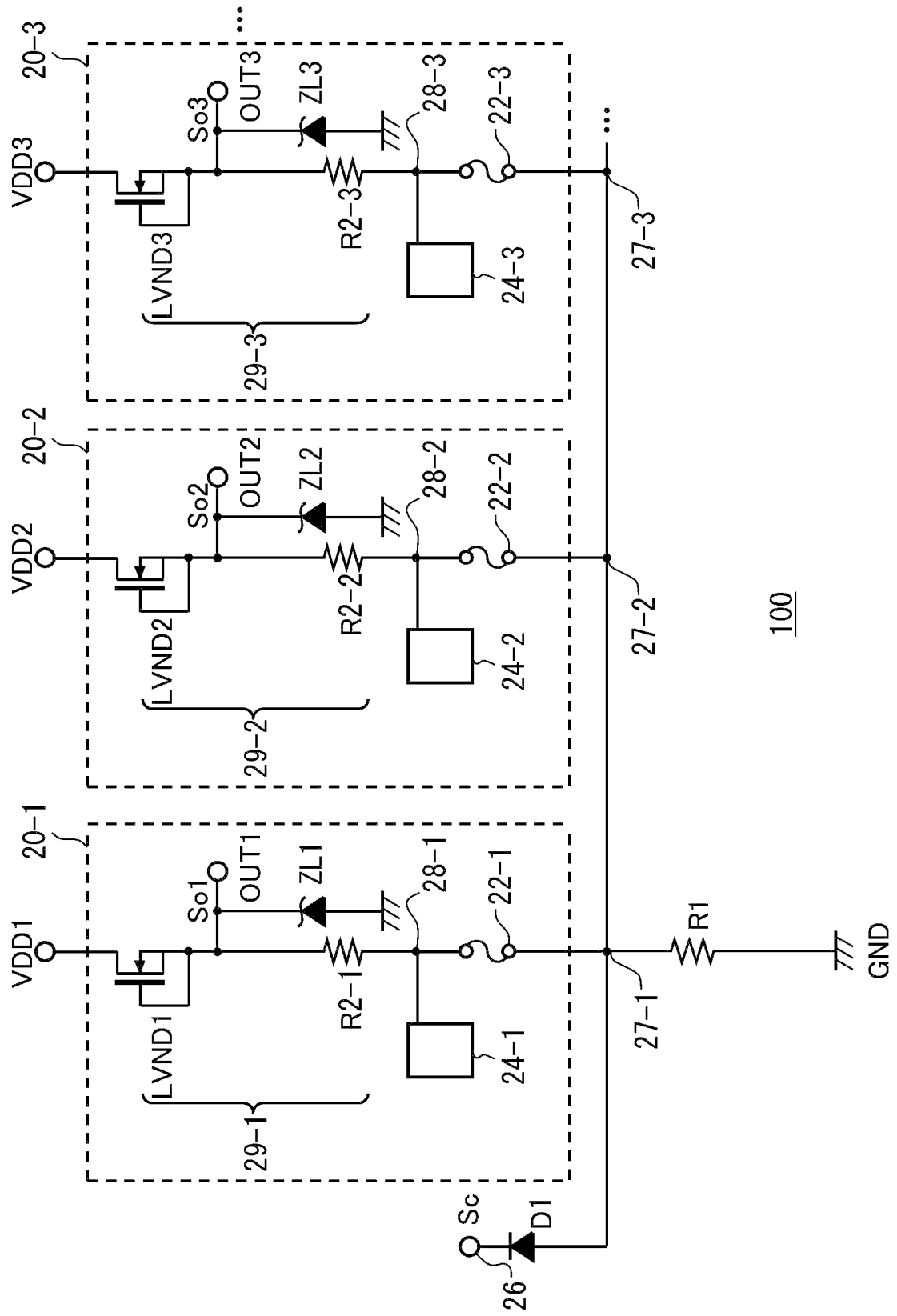
FIG. 15 illustrates another exemplary configuration of the trimming circuit 100.

FIG. 15 illustrates another exemplary configuration of the trimming circuit 100. The trimming circuit 100 of the present example includes a plurality of body portions 20. Also in the present example, similarly to the example of FIG. 14, the first diode D1 and the first resistor element R1 are provided in common to the plurality of body portions 20. Note that, the first diode D1 of the present example is connected to the connection point 27-$k$ between each fuse resistor 22-$k$ and the ground potential. In addition, the first resistor element R1 is connected between each of the connection points 27 and the ground potential.

The body portion 20 of the present example outputs a voltage according to the high-potential wiring VDD from the output terminal OUT, in a state where the fuse resistor 22 is disconnected. In addition, the body portion 20 of the present example outputs a voltage according to the ground potential from the output terminal OUT, in a state where the fuse resistor 22 is not disconnected.

In each of the body portions 20, the fuse resistor 22, the first diode D1, and the first resistor element R1 are connected. Each of the fuse resistors 22-$k$ have one end connected to the pad 24-$k$ and another end connected to the first diode D1 and the first resistor element R1. The second resistor element R2-$k$ is connected to the connection point 28-$k$ between the pad 24-$k$ and the fuse resistor 22-$k$. The second resistor element R2-$k$ has one end connected to the connection point 28-$k$, and another end connected to the resistor element LVND$k$.

The resistor element LVND$k$ has one end connected to the second resistor element R2-$k$ and another end connected to the high-potential wiring VDD. In the present example, the connection point between the resistor element LVND$k$ and the second resistor element R2-$k$ is connected to the output terminal OUT$k$. A protection diode ZL may be provided between the output terminal OUT$k$ and the ground potential.

Also in the present example, the scale of the device can be reduced by providing a first diode D1 in common to the plurality of body portions 20. In addition, the scale of the device can be reduced by providing a first resistor element R1 in common to the plurality of body portions 20.

In the present example, one fuse resistor 22 to be disconnected is selected at a time, and a predetermined high voltage is applied, in order, to a pad 24-$k$ corresponding to the fuse resistor 22-$k$ to be disconnected. As described above, said high voltage may be a voltage that is higher than the voltage applied to the high-potential wiring VDD. Ground potential may be applied to the unselected pads 24, for example. In addition, the ground potential applied to the selected body portion 20 of which the fuse resistor 22 is to be disconnected may be caused to rise. In this way, the a current flowing from the pad 24-$k$ to the second resistance portion 29-$k$ can be suppressed. In addition, the ground potential may also be caused to rise in the unselected body portions 20. In addition, in a case where virtual disconnection is set, a voltage for the virtual disconnection may be applied in parallel to each pad 24. That is, each of the body portions 20 can be set to be in a virtual disconnection state in parallel. In addition, some of the body portions 20 may be selectively set to be in a virtual disconnection state.

Figure 16:
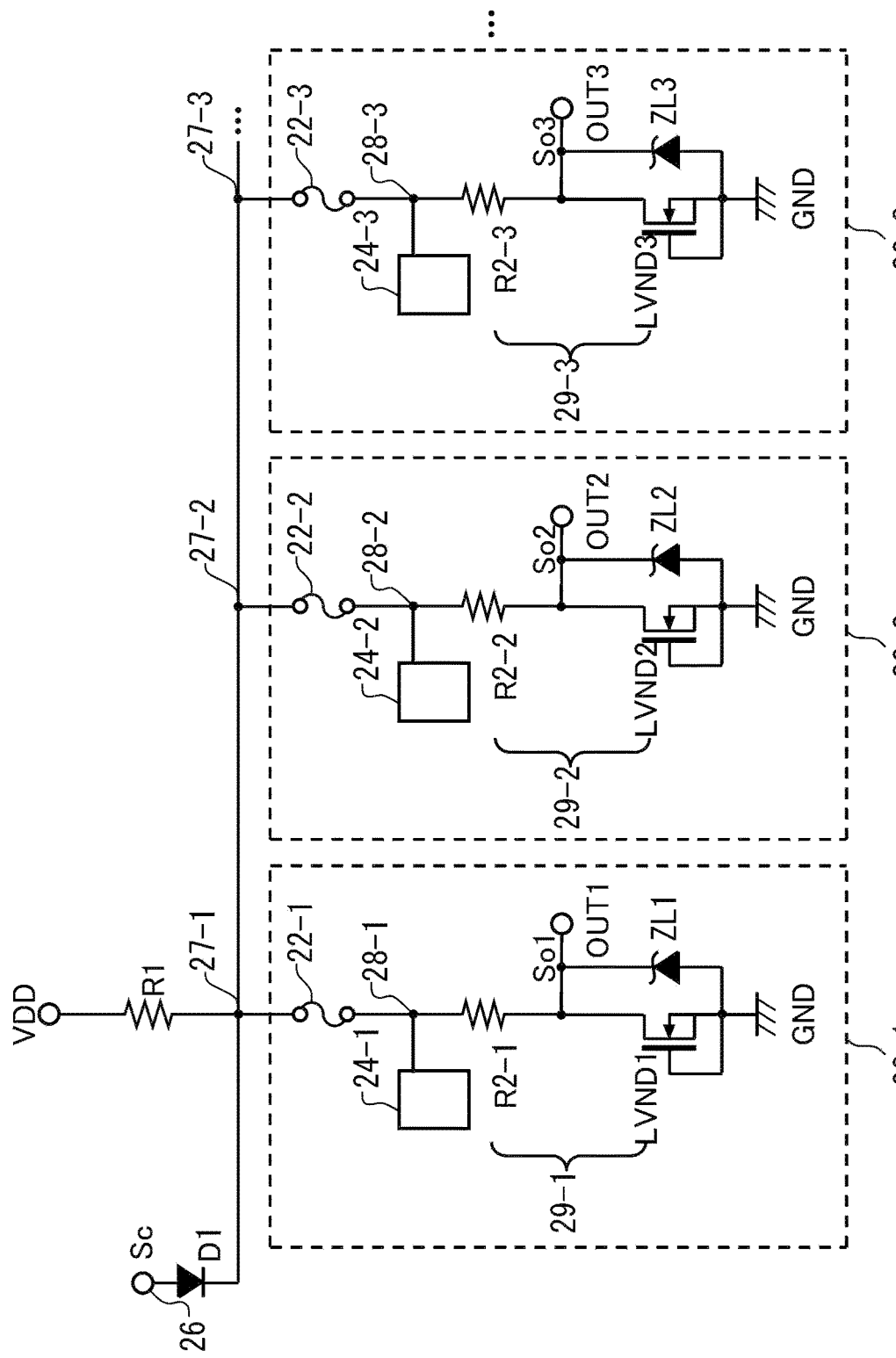
FIG. 16 illustrates another exemplary configuration of the trimming circuit 100.

FIG. 16 illustrates another exemplary configuration of the trimming circuit 100. The trimming circuit 100 of the present example differs from the example of FIG. 14 in that the orientation of the anode and the cathode of the first diode D1 are reversed as compared to the example of FIG. 14. Other structures are similar to those in the example of FIG. 14. That is, the first diode D1 of the present example have the fuse resistor 22 of each of the body portions 20 connected to its cathode, and the substrate potential Sc applied to its anode. Each of the fuse resistors 22-$k$ have one end connected to the pad 24-$k$, and another end connected to the cathode of the first diode D1 via the connection point 27-$k$.

In the present example, a low voltage is selectively applied to the pad 24-$k$ of the body portion 20-$k$ of which the fuse resistor 22-$k$ is to be disconnected. Said low voltage is a voltage that is low enough for a forward current to flow from the first diode D1 to the pad 24-$k$. That is, said low potential is lower than the substrate voltage Sc by the forward voltage of the first diode D1 or more. For example, the low voltage is a voltage that is lower than the ground potential.

Figure 17:
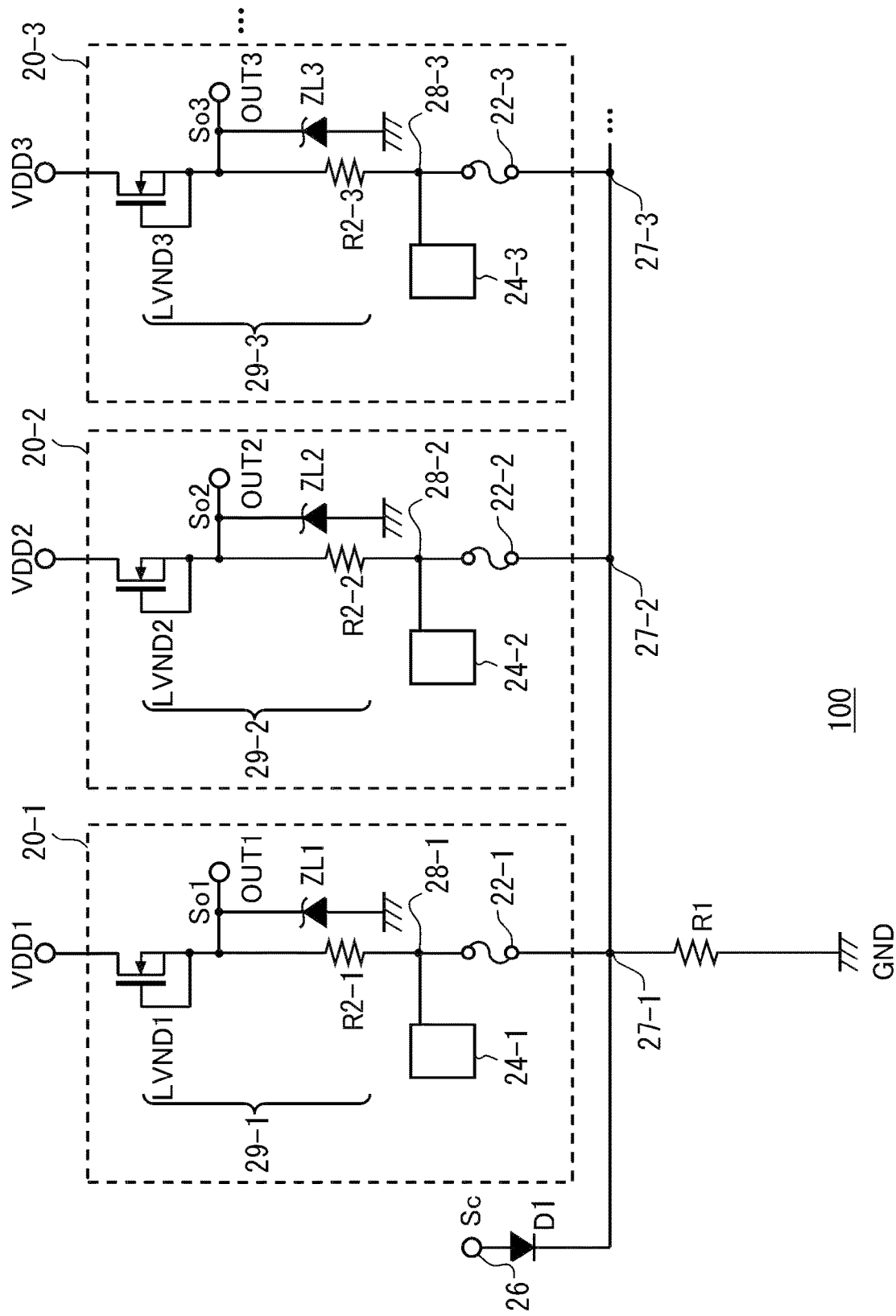
FIG. 17 illustrates another exemplary configuration of the trimming circuit 100.

FIG. 17 illustrates another exemplary configuration of the trimming circuit 100. The trimming circuit 100 of the present example differs from the example of FIG. 15 in that the orientation of the anode and the cathode of the first diode D1 are reversed as compared to the example of FIG. 15. Other structures are similar to those in the example of FIG. 15. That is, the first diode D1 of the present example have the fuse resistor 22 of each of the body portions 20 connected to its cathode, and the substrate potential Sc applied to its anode. Each of the fuse resistors 22-$k$ have one end connected to the pad 24-$k$, and another end connected to the cathode of the first diode D1 via the connection point 27-$k$.

In the present example, a low voltage is selectively applied to the pad 24-$k$ of the body portion 20-$k$ of which the fuse resistor 22-$k$ is to be disconnected. Said low voltage is a voltage that is low enough for a forward current to flow from the first diode D1 to the pad 24-k. That is, said low potential is lower than the substrate voltage Sc by the forward voltage of the first diode D1 or more. For example, the low voltage is a voltage that is lower than the ground potential. In addition, in a case where virtual disconnection is set, a voltage for the virtual disconnection may be applied in parallel to each pad 24. That is, each of the body portions 20 can be set to be in a virtual disconnection state in parallel. In addition, some of the body portions 20 may be selectively set to be in a virtual disconnection state.

Figure 18:
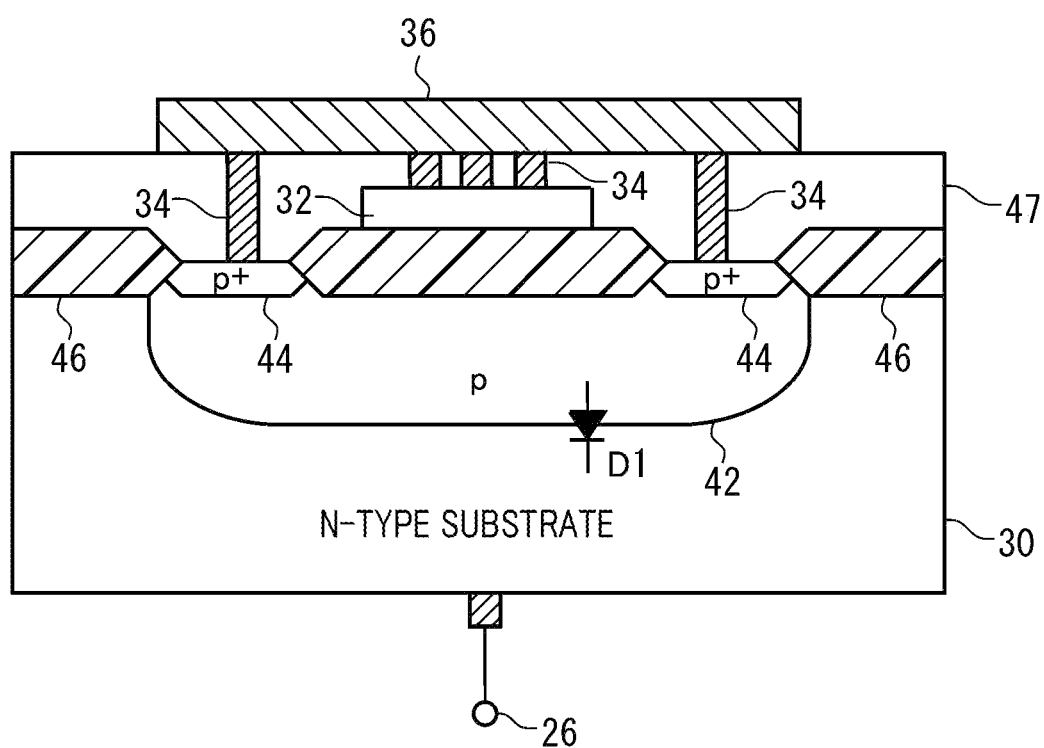
FIG. 18 illustrates another exemplary configuration of the first diode D1.

FIG. 18 illustrates another exemplary configuration of the first diode D1. The first diode D1 in each example may have the structure of FIG. 18. The first diode D1 of the present example is formed on the semiconductor substrate 30. The semiconductor substrate 30 may have elements other than the first diode D1 formed thereon, as illustrated in FIG. 6 and the like.

In the present example, the semiconductor substrate 30 is an n-type semiconductor substrate 30. As illustrated in FIG. 18, a p-type first semiconductor region 42 is formed on the front surface side of the semiconductor substrate 30. A p-n junction is formed by the first semiconductor region 42 and the semiconductor substrate 30. This p-n junction functions as the first diode D1.

The first diode D1 may be a vertical diode. In the present example, the anode is arranged on the front surface side of the semiconductor substrate 30, and the cathode is arranged on the back surface side of the semiconductor substrate 30. A substrate electrode 26 is connected to the cathode. However, even when it is a vertical diode, the substrate electrode 26 may be provided on the front surface side of the semiconductor substrate 30, since the potential of the semiconductor substrate 30 may be fixed.

A p+-type second semiconductor region 44 may be formed in a part of the first semiconductor region 42. The second semiconductor region 44 has a higher impurity concentration than the first semiconductor region 42. An insulating film 46 is partially provided on the semiconductor substrate 30. The insulating film 46 may be a LOCOS oxide film. At least a part of the second semiconductor region 44 is exposed by the insulating film 46.

A polysilicon layer 32 that functions as wiring may be provided above the insulating film 46. An interlayer dielectric film 47 is provided to cover the insulating film 46, the second semiconductor region 44, and the polysilicon layer 32. A through hole that forms a contact portion 34 is formed on the interlayer dielectric film 47. Metal wiring 36 is provided above the interlayer dielectric film 47. The metal wiring 36 is connected to the polysilicon layer 32 and the second semiconductor region 44 via the contact portion 34.

Figure 19:
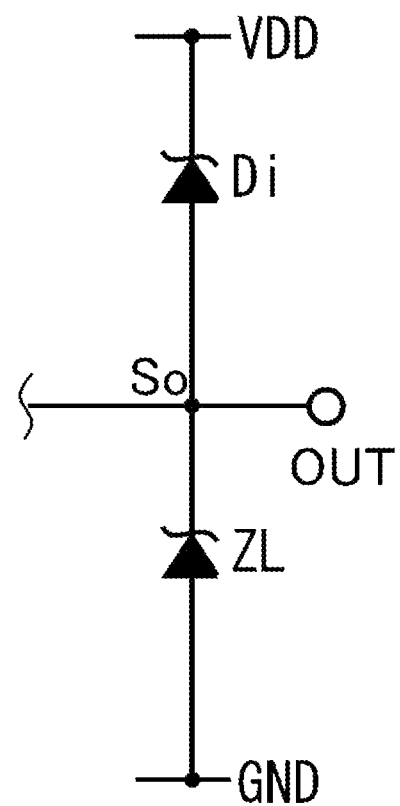
FIG. 19 describes a protection diode Di.

FIG. 19 describes a protection diode ZL and a protection diode Di. In the present example, the protection diode provided between the output terminal OUT and the ground potential GND is the protection diode Di, and the protection diode provided between the output terminal OUT and the high-potential wiring VDD is the protection diode ZL. Each of the body portions 20 may have one or both of the protection diode Di and the protection diode ZL provided thereon.

In a case where the transistor portion 10 connected to the output terminal OUT includes an n-channel MOS transistor, the protection diode ZL may be provided in the output terminal OUT. In this way, application of a voltage that is too high to the transistor portion 10 can be suppressed. In addition, in a case where the transistor portion 10 connected to the output terminal OUT includes a p-channel MOS transistor, the protection diode Di may be provided in the output terminal OUT. In this way, application of a voltage that is too low to the transistor portion 10 can be suppressed. In a case where the transistor portion 10 includes both of the n-channel MOS transistor such as the CMOS circuit and the p-channel MOS transistor, both of the protection diode Di and the protection diode ZL may be provided.

In the examples of FIG. 14 to FIG. 17, some of the body portions 20 may be provided with the protection diode Di, and some of the body portions 20 may be provided with the protection diode ZL. In addition, all of the body portions 20 may be provided with both of the protection diode Di and the protection diode ZL.

Components described with the same reference numerals in each embodiment may have similar characteristic, function, and structure. Note that, reference numerals including a branch number k and reference numerals that do not include the branch number k is considered the same reference numeral, as long as the reference numeral excluding the branch number are the same.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

2: element to be adjusted, 10: transistor portion, 11: gate, 12: drain, 13: source, 20: body portion, 21: body portion, 22: fuse resistor, 24: pad, 26: substrate electrode, 27: connection point, 28: connection point, 29: second resistance portion, 30: semiconductor substrate, 32: polysilicon layer, 34: contact portion, 36: metal wiring, 37: metal wiring, 38: coupling portion, 42: first semiconductor region, 44: second semiconductor region: 46: insulating film, 47: interlayer dielectric film, 52: p-well region, 53: cathode region, 54: anode region, 60: polysilicon, 62: insulating layer, 100: trimming circuit, 200: semiconductor device, 201: drift layer, 202: contact layer, 203: drain electrode, 210: output stage circuit portion, 212: p-type base layer, 213: p+-type layer, 214: n+-type layer, 215: conductive section, 216: insulating film: 220: source electrode, 222: insulating film, 230: control circuit portion, 240: MOS transistor, 241: p-well region, 242: source region, 243: drain region, 244: gate electrode, 245, gate insulating film, 246: source electrode, 247: drain electrode, 250: MOS transistor, 251: p-well region, 252: n-well region, 253: source region, 254: drain region, 255: gate electrode, 256: gate insulating film, 257: source electrode, 258: drain electrode

What is claimed is:

1. A trimming circuit comprising:
  a body portion configured to output a voltage according to a presence or absence of disconnection of a fuse resistor, the body portion including:
    a fuse resistor formed by a polysilicon layer arranged on a semiconductor substrate via an insulating film;
    a pad for trimming connected to one end of the fuse resistor;
    an output terminal electrically connected to a connection point between the fuse resistor and the pad, and configured to output a voltage according to the presence or absence of disconnection of the fuse resistor; and
    a diode formed on the semiconductor substrate, having one end connected to another end of the fuse resistor;
  a second resistance portion having one end connected to the connection point between the fuse resistor and the pad, and another end connected to second potential; and
  a protection diode connected between the other end of the second resistance portion and the output terminal.

2. The trimming circuit according to claim 1, wherein the diode includes a semiconductor region of a second conductivity type formed on the semiconductor substrate of a first conductivity type.

3. The trimming circuit according to claim 1, further comprising a first resistance portion having one end connected to a connection point between the fuse resistor and the diode, and another end connected to first potential.

4. The trimming circuit according to claim 2, further comprising a first resistance portion having one end connected to a connection point between the fuse resistor and the diode, and another end connected to first potential.

5. A trimming circuit according to claim 1, further comprising:
  a body portion configured to output a voltage according to a presence or absence of disconnection of a fuse resistor, the body portion including:
    a fuse resistor formed by a polysilicon layer arranged on a semiconductor substrate via an insulating film;
    a pad for trimming connected to one end of the fuse resistor;
    an output terminal electrically connected to a connection point between the fuse resistor and the pad, and configured to output a voltage according to the presence or absence of disconnection of the fuse resistor; and
    a diode formed on the semiconductor substrate, having one end connected to another end of the fuse resistor; and
  a transistor portion formed on the semiconductor substrate, and having a control terminal connected to the output terminal.

6. A trimming circuit according to claim 1, wherein comprising:
  a body portion configured to output a voltage according to a presence or absence of disconnection of a fuse resistor, the body portion including:
    a fuse resistor formed by a polysilicon layer arranged on a semiconductor substrate via an insulating film;
    a pad for trimming connected to one end of the fuse resistor;
    an output terminal electrically connected to a connection point between the fuse resistor and the pad, and configured to output a voltage according to the presence or absence of disconnection of the fuse resistor; and
    a diode formed on the semiconductor substrate, having one end connected to another end of the fuse resistor, wherein
  the diode is a vertical diode, and
  another end of the diode is connected to a substrate electrode of the semiconductor substrate.

7. A trimming circuit comprising:
  a body portion configured to output a voltage according to a presence or absence of disconnection of a fuse resistor, the body portion including:
    a fuse resistor formed by a polysilicon layer arranged on a semiconductor substrate via an insulating film;
    a pad for trimming connected to one end of the fuse resistor;
    an output terminal electrically connected to a connection point between the fuse resistor and the pad, and configured to output a voltage according to the presence or absence of disconnection of the fuse resistor; and
    a diode formed on the semiconductor substrate, having one end connected to another end of the fuse resistor, wherein
  the diode includes a semiconductor region of a second conductivity type formed on the semiconductor substrate of a first conductivity type,
  the first conductivity type is an n-type and the second conductivity type is a p-type,
  another end of the fuse resistor and an anode of the diode are connected, and
  the trimming circuit further comprising:
    a first resistance portion having one end connected to a connection point between the fuse resistor and the anode of the diode, and another end connected to high-potential wiring; and
    a second resistance portion having one end connected to the connection point between the fuse resistor and the pad, and another end connected to ground wiring.

8. A trimming circuit comprising:
  a body portion configured to output a voltage according to a presence or absence of disconnection of a fuse resistor, the body portion including:
    a fuse resistor formed by a polysilicon layer arranged on a semiconductor substrate via an insulating film;
    a pad for trimming connected to one end of the fuse resistor;
    an output terminal electrically connected to a connection point between the fuse resistor and the pad, and configured to output a voltage according to the presence or absence of disconnection of the fuse resistor; and
    a diode formed on the semiconductor substrate, having one end connected to another end of the fuse resistor, wherein
  the diode includes a semiconductor region of a second conductivity type formed on the semiconductor substrate of a first conductivity type,
  the first conductivity type is a p-type, and the second conductivity type is an n-type,
  another end of the fuse resistor and a cathode of the diode are connected, and the trimming circuit further comprising:
a first resistance portion having one end connected to a connection point between the fuse resistor and the cathode of the diode, and another end connected to ground wiring; and
a second resistance portion having one end connected to the connection point between the fuse resistor and the pad, and another end connected to high-potential wiring.

9. A trimming circuit comprising:
a body portion configured to output a voltage according to a presence or absence of disconnection of a fuse resistor, the body portion including:
a fuse resistor formed by a polysilicon layer arranged on a semiconductor substrate via an insulating film;
a pad for trimming connected to one end of the fuse resistor;
an output terminal electrically connected to a connection point between the fuse resistor and the pad, and configured to output a voltage according to the presence or absence of disconnection of the fuse resistor; and
a diode formed on the semiconductor substrate, having one end connected to another end of the fuse resistor; and
a plurality of body portions, each of which being identical to the body portion, wherein
the diode is provided in common among the plurality of body portions, and
the other end of the fuse resistor of each of the body portion is connected to the diode.

10. The trimming circuit according to claim 9, further comprising a first resistance portion provided in common among the plurality of body portions, and having one end connected to the diode and another end connected to high-potential wiring, wherein
the other end of the fuse resistor of each of the body portions is connected to the one end of the first resistance portion.

11. The trimming circuit according to claim 9, further comprising a first resistance portion provided in common among the plurality of body portions, and having one end connected to the diode and another end connected to ground wiring, wherein
the other end of the fuse resistor of each of the body portions is connected to the one end of the first resistance portion.

12. The trimming circuit according to claim 9, wherein the other end of the fuse resistor of each of the plurality of body portions is connected to a cathode of the diode.

13. The trimming circuit according to claim 9, wherein the other end of the fuse resistor of each of the plurality of body portions is connected to an anode of the diode.

14. A trimming method for adjusting electrical property of an element to be adjusted using a trimming circuit, the trimming circuit including a body portion configured to output a voltage according to a presence or absence of disconnection of a fuse resistor, the body portion including:
a fuse resistor formed by a polysilicon layer arranged on a semiconductor substrate via an insulating film;
a pad for trimming connected to one end of the fuse resistor;
an output terminal electrically connected to a connection point between the fuse resistor and the pad, and configured to output a voltage according to the presence or absence of disconnection of the fuse resistor; and
a diode formed on the semiconductor substrate, having one end connected to another end of the fuse resistor, wherein
the trimming method comprises:
adjusting potential of the semiconductor substrate and a voltage applied to the pad, such that a forward current flows through the diode; and
disconnecting the fuse resistor due to the forward current flowing through the fuse resistor.

15. The trimming method according to claim 14, further comprising
applying a predetermined voltage to the pad before the step of causing forward current to flow through the diode, thereby generating a state in which the fuse resistor is virtually disconnected.

16. The trimming method according to claim 14, wherein after the fuse resistor is disconnected, the pad and the output terminal are electrically connected.

17. The trimming method according to claim 14, wherein the trimming circuit includes a plurality of body portions, each of which being identical to the body portion, the diode is provided in common among the plurality of body portions, and the other end of the fuse resistor of each of the plurality of body portions is connected to the diode, and
at the step of adjusting the voltage, a voltage is selectively applied to the pad of the body portion of which the fuse resistor is to be disconnected.

18. The trimming method according to claim 17, wherein high potential and ground potential are applied to each of the plurality of body portions, and
at the step of adjusting the voltage, the ground potential applied to the body portion of which the fuse resistor is to be disconnected is changed.

* * * * *